(12) United States Patent
Jeon et al.

(10) Patent No.: US 11,538,888 B2
(45) Date of Patent: Dec. 27, 2022

(54) DISPLAY PANEL INCLUDING A SHIELD LAYER AND DISPLAY DEVICE INCLUDING THE SAME

(71) Applicant: Samsung Display Co., Ltd., Yongin-si (KR)

(72) Inventors: Yujin Jeon, Yongin-si (KR); Wonse Lee, Yongin-si (KR); Donghyeon Jang, Yongin-si (KR); Sukyoung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 164 days.

(21) Appl. No.: 16/995,636

(22) Filed: Aug. 17, 2020

(65) Prior Publication Data

US 2021/0091165 A1 Mar. 25, 2021

(30) Foreign Application Priority Data

Sep. 20, 2019 (KR) .......................... 10-2019-0116343

(51) Int. Cl.
| H01L 29/08 | (2006.01) |
| H01L 27/32 | (2006.01) |
| H01L 51/52 | (2006.01) |

(52) U.S. Cl.
CPC ...... *H01L 27/3276* (2013.01); *H01L 27/3262* (2013.01); *H01L 27/3265* (2013.01); *H01L 27/3272* (2013.01); *H01L 51/5246* (2013.01)

(58) Field of Classification Search
CPC ............ H01L 27/3276; H01L 27/3262; H01L 27/3265; H01L 27/3272; H01L 51/5246

USPC .......................................................... 257/40
See application file for complete search history.

(56) References Cited

U.S. PATENT DOCUMENTS

| 10,304,913 | B2 | 5/2019 | Choi et al. | |
| 2010/0039848 | A1* | 2/2010 | Meijer | G02F 1/011 365/114 |
| 2017/0294502 | A1 | 10/2017 | Ka et al. | |
| 2017/0330515 | A1 | 11/2017 | Jeong et al. | |
| 2017/0330927 | A1* | 11/2017 | Lee | H01L 27/3265 |
| 2017/0355313 | A1* | 12/2017 | Park | G02F 1/163 |
| 2018/0108724 | A1* | 4/2018 | Lee | H01L 27/3279 |
| 2019/0317361 | A1* | 10/2019 | Ito | G02F 1/136209 |
| 2020/0176603 | A1* | 6/2020 | Baeck | H01L 27/3272 |

FOREIGN PATENT DOCUMENTS

| CN | 109119447 A | 1/2019 |
| KR | 10-2017-0066767 A | 6/2017 |
| KR | 10-2017-0117291 A | 10/2017 |
| KR | 10-2018-0071997 A | 6/2018 |

\* cited by examiner

*Primary Examiner* — Phuc T Dang
(74) *Attorney, Agent, or Firm* — Lewis Roca Rothgerber Christie LLP

(57) ABSTRACT

A display device includes a display panel having improved reliability and a reduced non-display area. The display panel includes: a substrate including a non-display area and a display area outside the non-display area, the non-display area surrounding an transmission area; a plurality of display elements arranged in the display area; a plurality of first lines extending in a first direction and including a detour portion that detours around an edge of the transmission area; and a shield layer arranged over the detour portion of the non-display area so as to overlap the detour portion and include a hole corresponding to the transmission area.

21 Claims, 25 Drawing Sheets

DISPLAY PANEL INCLUDING A SHIELD LAYER AND DISPLAY DEVICE INCLUDING THE SAME

CROSS-REFERENCE TO RELATED APPLICATION

This application claims priority to and the benefit of Korean Patent Application No. 10-2019-0116343, filed on Sep. 20, 2019, in the Korean Intellectual Property Office, the entire content of which is incorporated herein by reference.

BACKGROUND

1. Field

One or more aspects of embodiments of the present disclosure relate to a display panel and a display device including the same, and for example, to a display panel having improved reliability and a reduced non-display area, and a display device including the display panel.

2. Description of Related Art

Recently, the purposes of display devices have been diversifying. In addition, as display devices have become thinner and more lightweight, their range of use has gradually been extended.

As display devices are used in various ways, their shapes may be designed in various ways. In addition, an increasing number of functions may be combined or associated with display devices.

SUMMARY

As an increasing number of functions may be combined or associated with display devices, one or more aspects of embodiments of the present disclosure are directed toward a display panel including an transmission area within a display area, inside which a camera, a sensor, etc. may be arranged, and a display device including the display panel. However, it should be understood that the embodiments described herein should be considered in a descriptive sense only, and do not limit the disclosure.

Additional aspects will be set forth in part in the description that follows and, in part, will be apparent from the description, or may be learned by practice of the presented embodiments of the disclosure.

One or more example embodiments of the present disclosure provide a display panel including: a substrate including a non-display area and a display area outside (e.g., surrounding) the non-display area, the non-display area surrounding a transmission area, a plurality of display elements (e.g., organic light-emitting diodes) arranged in the display area, a plurality of first lines extending in a first direction, each including a detour portion that detours around an edge of the transmission area, and a shield layer overlapping the detour portions of the non-display area, wherein each of the plurality of first lines is located in the non-display area and includes a first conductive line or a second conductive line including the detour portion, and the first conductive line(s) and the second conductive line(s) are alternately arranged on different layers.

The shield layer may have a constant voltage.

The shield layer may not overlap (e.g., may not be over) the transmission area.

The shield layer may have a hole corresponding to the transmission area.

The display panel may further include a plurality of second lines extending in the first direction and having the same voltage as the shield layer.

The shield layer and the plurality of second lines may include the same material.

The display panel may further include a plurality of third lines extending in a second direction intersecting with (e.g., crossing) the first direction in the display area and disconnected outside the non-display area.

A distance between the first conductive line and the second conductive line closest to each other (e.g., adjacent lines) may be less than a width of each of the first conductive line and the second conductive line.

Each of the plurality of first lines may further include a third conductive line located in the display area.

The third conductive line may be arranged over the first conductive line and the second conductive line with an insulating layer therebetween, and may be connected to the first conductive line or the second conductive line through a contact hole defined in the insulating layer.

The display panel may further include a thin film transistor and a storage capacitor, each being arranged in the display area and connected to each of the plurality of display elements, wherein the thin film transistor may include a semiconductor layer, a gate electrode, and an electrode layer, the gate electrode overlapping at least a portion of the semiconductor layer, and the electrode layer being connected to the semiconductor layer, and the storage capacitor may include a bottom electrode and a top electrode, the bottom electrode including the same material as the gate electrode, and the top electrode being arranged between the bottom electrode and the electrode layer.

The first conductive line and the gate electrode may include or be formed of the same material.

The second conductive line and the top electrode may include or be formed of the same material.

The third conductive line and the electrode layer may include or be formed of the same material.

The shield layer and the electrode layer may include or be formed of the same material.

The display panel may further include a fourth conductive line arranged below the second conductive line so as to overlap the second conductive line.

The fourth conductive line and the semiconductor layer may include or be formed of the same material.

The fourth conductive line may be greater in width than the second conductive line.

The same voltage may be applied to the shield layer and the fourth conductive line.

The display panel may further include an encapsulation substrate covering the plurality of display elements and facing the substrate, and a sealing material surrounding the display area between the substrate and the encapsulation substrate.

The display panel may further include a material layer between the substrate and the encapsulation substrate, the material layer including at least one of an organic material, an inorganic material, and a conductive material, wherein the material layer may be arranged except in the transmission area.

One or more example embodiments of the present disclosure provide a display device including a substrate including a non-display area and a display area outside (e.g., surrounding) the non-display area, the non-display area surrounding a transmission area, a plurality of display elements arranged in the display area, a plurality of first lines extending in a first direction, each including a detour portion that detours around an edge the transmission area, a shield layer arranged over the detour portions in the non-display area, and a component including an electronic element corresponding to the transmission area.

The above and other aspects, features, and advantages of embodiments of the present disclosure will be more apparent from the following description, accompanying drawings, and claims.

These general and specific aspects may be carried out by a system, a method, a computer program, or a combination of a certain system, method, and computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
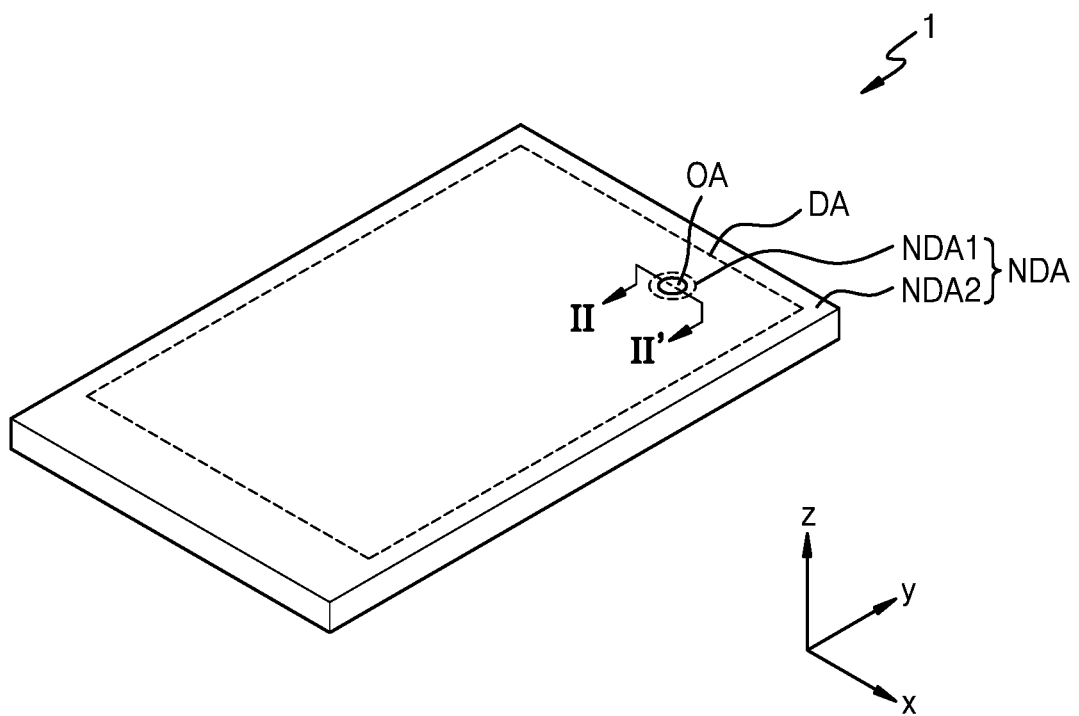
FIG. 1 is a perspective view of a display device according to an embodiment.

Reference will now be made in more detail to embodiments, examples of which are illustrated in the accompanying drawings, wherein like reference numerals refer to like elements throughout and duplicative descriptions may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be understood that although the terms "first," "second," etc. may be used herein to describe various components, these components should not be limited by these terms. Such terms are only used to distinguish one component from another.

As used herein, the singular forms "a," "an," and "the" are intended to include the plural forms as well, unless the context clearly indicates otherwise. Further, the use of "may" when describing embodiments of the present disclosure refers to "one or more embodiments of the present disclosure".

It will be further understood that the terms "comprises," "comprising," "includes," and "including" used herein specify the presence of stated features or components, but do not preclude the presence or addition of one or more other features or components. As used herein, expressions such as "at least one of", "one of", and "selected from", when preceding a list of elements, modify the entire list of elements and do not modify the individual elements of the list.

It will be understood that when a layer, region, or component is referred to as being "formed on" another layer, region, or component, it can be directly or indirectly formed on the other layer, region, or component. In some embodiments, for example, intervening layers, regions, or components may be present.

The sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment can be implemented differently, a specific process order may be performed differently from the described order. For example, two consecutively described processes may be performed substantially at the same time, or may be performed in an order opposite the described order.

In the present specification, "A and/or B" may refer to A or B, or A and B. In the present specification, "at least one of A and B" means A or B, or A and B.

Spatially relative terms, such as "beneath," "below," "lower," "above," "upper," "bottom," "top" and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that when a layer, region, or component is referred to as being "connected" to another layer, region, or component, it may be "directly connected" to the other layer, region, or component, and/or may be "indirectly connected" to the other layer, region, or component with another layer, region, or component interposed therebetween. For example, it will be understood that when a layer, region, or component is referred to as being "electrically connected" to another layer, region, or component, it may be "directly electrically connected" to the other layer, region, or component and/or may be "indirectly electrically connected" to other layer, region, or component with other layer, region, or component interposed therebetween.

In the following examples, the x-axis, the y-axis and the z-axis are not limited to the three axes of the rectangular coordinate system, and may be interpreted in a broader sense. In some embodiments, for example, the x-axis, the y-axis, and the z-axis may be perpendicular to one another, or may represent different directions that are not perpendicular to one another.

FIG. 1 is a perspective view of a display device 1 according to an embodiment.

Referring to FIG. 1, the display device 1 includes a display area DA, through which light is emitted, and a non-display area NDA, through which light is not emitted. The display device 1 may display an image using light emitted from a plurality of pixels P arranged in the display area DA.

The display device 1 includes an opening area OA as a transmission area.

The opening area OA may be at least partially surrounded by the display area DA. In the embodiment of FIG. 1, the opening area OA is entirely surrounded by the display area DA. The non-display area NDA may include a first non-display area NDA1 and a second non-display area NDA2, the first non-display area NDA1 surrounding the opening area OA, and the second non-display area NDA2 surrounding the display area DA. For example, the first non-display area NDA1 may entirely surround the opening area OA, the display area DA may entirely surround the first non-display area NDA1, and the second non-display area NDA2 may entirely surround the display area DA.

The opening area OA may be a location or position in which an electronic element is arranged, as described below with reference to FIG. 2A, etc. The opening area OA may be a transmission area through which light and/or sound output from an electronic element may pass or progress between the electronic element and the outside (e.g., in either direction). In an embodiment, in the case where light passes through the opening area OA, a light transmittance may be 50% or more, 70% or more, 75% or more, 80% or more, or 85% or more, or 90% or more.

Hereinafter, though the display device 1 according to an embodiment is described as an organic light-emitting display device as an example, the present disclosure is not limited thereto. In another embodiment, the display device 1 may be of any suitable display technology, for example, an inorganic light-emitting display and/or a quantum dot light-emitting display. For example, an emission layer of a display element within the display device 1 may include an organic material, an inorganic material, quantum dots, an organic material and quantum dots, or an inorganic material and quantum dots.

Though it is shown in FIG. 1 that the opening area OA is arranged on one side (an upper right side) of the display area DA, which has a quadrangular shape, the embodiment is not limited thereto. The shape of the display area DA is not particularly limited, and may be for example a circle, an ellipse, or a polygon (such as a triangle or a pentagon).

Further, the location of the opening area OA with respect to the display area DA may be changed to any suitable location.

FIGS. 2A to 2D are cross-sectional views of the display device 1 according to various suitable embodiments, taken along line II-II' of FIG. 1.

Figure 2A:
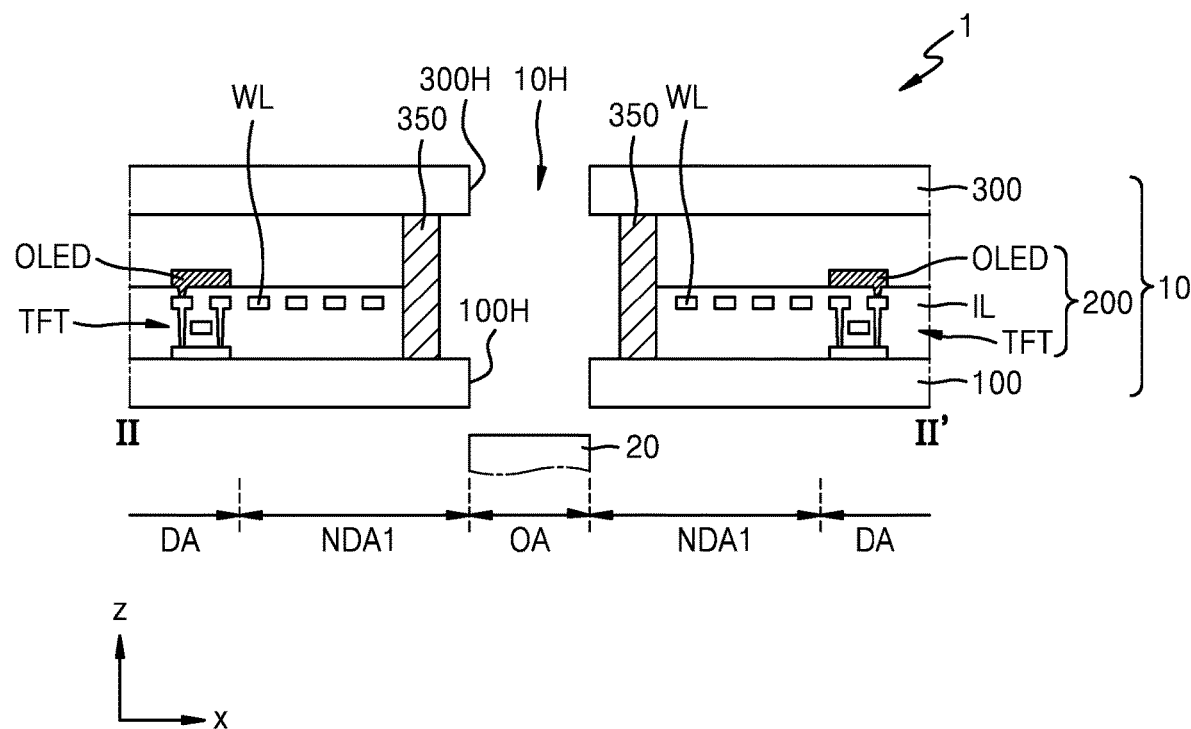
FIGS. 2A to 2D are cross-sectional views of a display device according to embodiments, taken along line II-II' of FIG. 1.

Referring to FIG. 2A, the display device 1 may include a display panel 10 and a component 20 (e.g., electronic component 20), the display panel 10 including a display element, and the component 20 corresponding to (e.g., being positioned within or in the middle of) the opening area OA.

The display panel 10 may include a substrate 100, an encapsulation substrate 300, and a display element layer 200 therebetween, the encapsulation substrate 300 serving as an encapsulation member and facing the substrate 100. A sealing material 350 (sealant) covering lateral (e.g., vertical) sides of the display element layer 200 may be arranged between the substrate 100 and the encapsulation substrate 300. Though it is shown in FIG. 2A that the sealing material 350 is arranged on two opposite sides of the opening area OA, the opening area OA may be entirely surrounded by the sealing material 350 when viewed in a direction perpendicular to a main surface of the substrate 100 (e.g., in a plan view).

The substrate 100 may include a glass and/or a polymer resin. The polymer resin may include polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 including the polymer resin may be flexible, rollable, and/or bendable. The substrate 100 may have a multi-layered structure including, for example, a layer including the above polymer resin and/or an inorganic layer. The encapsulation substrate 300 may similarly include a glass and/or a polymer resin.

The display element layer 200 may include a circuit layer, an organic light-emitting diode OLED, and an insulating layer IL therebetween, the circuit layer including a thin film transistor TFT, and the organic light-emitting diode OLED serving as a display element connected to the thin film transistor TFT. The thin film transistor TFT and the organic light-emitting diode OLED connected thereto may be arranged in the display area DA. Some wiring lines WL of the display element layer 200 may be located in the first non-display area NDA1. The wiring lines WL may provide a set or predetermined signal or voltage to pixels spaced apart from each other with the opening area OA therebetween. Although the embodiment depicted in FIG. 2A shows that the wiring lines WL do not overlap the sealing material 350 in the first non-display area NDA1, in some embodiments a portion of the sealing material 350 may be arranged over the wiring lines WL.

The display panel 10 may include a through hole 10H corresponding to (e.g., over) the opening area OA. For example, the substrate 100 and the encapsulation substrate 300 may respectively include through holes 100H and 300H, each corresponding to the opening area OA. The display element layer 200 may include a through hole corresponding to the opening area OA.

In some embodiments, additional elements such as an input sensing member, a reflection prevention member, and/or a transparent window may be further arranged on the display panel 10, the input sensing member sensing a touch input, and the reflection prevention member including a polarizer and a retarder, and/or a color filter and a black matrix.

The component 20 may be located in the opening area OA. The component 20 may be an electronic element that uses (e.g., that is capable of generating and/or processing) light or sound. For example, the electronic element may be a sensor (such as an infrared sensor that emits and/or receives light), a camera that receives light and captures an image, a sensor that outputs and senses light or sound to measure a distance or recognize a fingerprint, a small lamp that outputs light, or a speaker that outputs sound. An electronic element that uses light may use light in various wavelength bands (such as visible light, infrared light, and/or ultraviolet light). As shown in FIG. 2A, in the case where the display panel 10 includes the through hole 10H corresponding to the opening area OA, light or sound output from or received by the electronic element may be more effectively utilized.

Figure 2B:
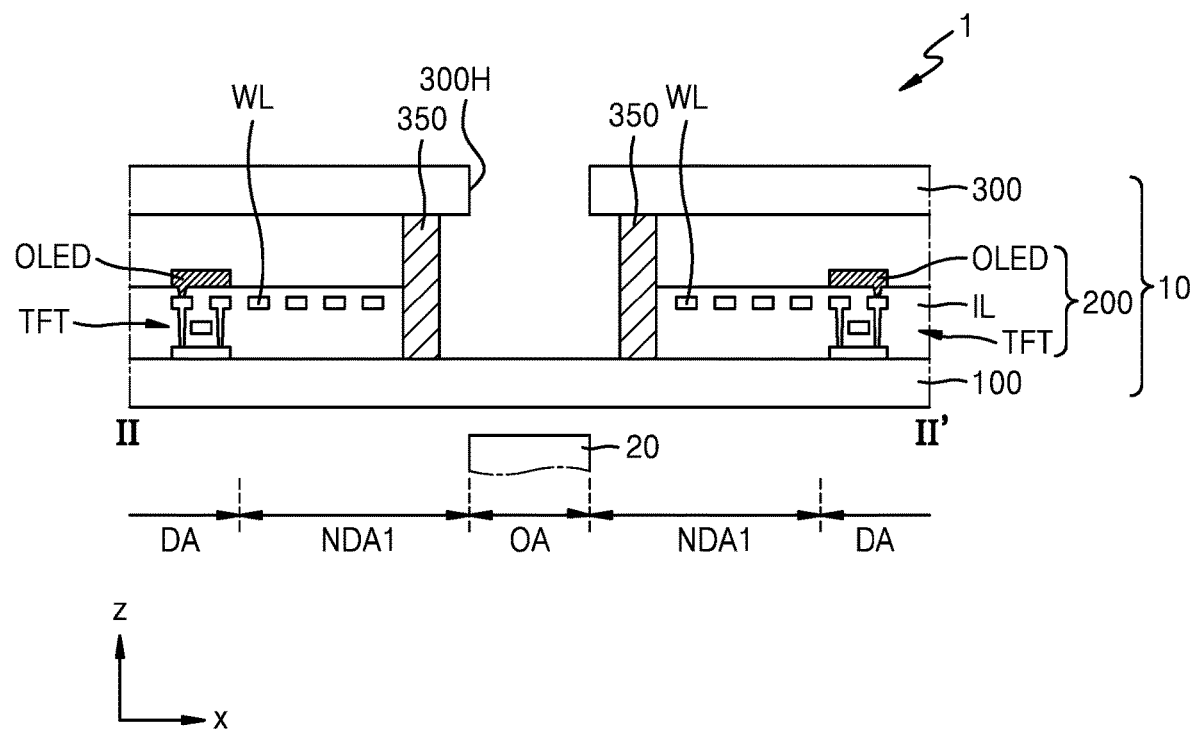

In some embodiments, unlike the display panel 10 including the through hole 10H corresponding to the opening area OA shown in FIG. 2A, some of the elements of the display panel 10 may not include a through hole. For example, as shown in FIG. 2B, the encapsulation substrate 300 may include the through hole 300H corresponding to the opening area OA, but the substrate 100 may not include a through hole.

Figure 2C:
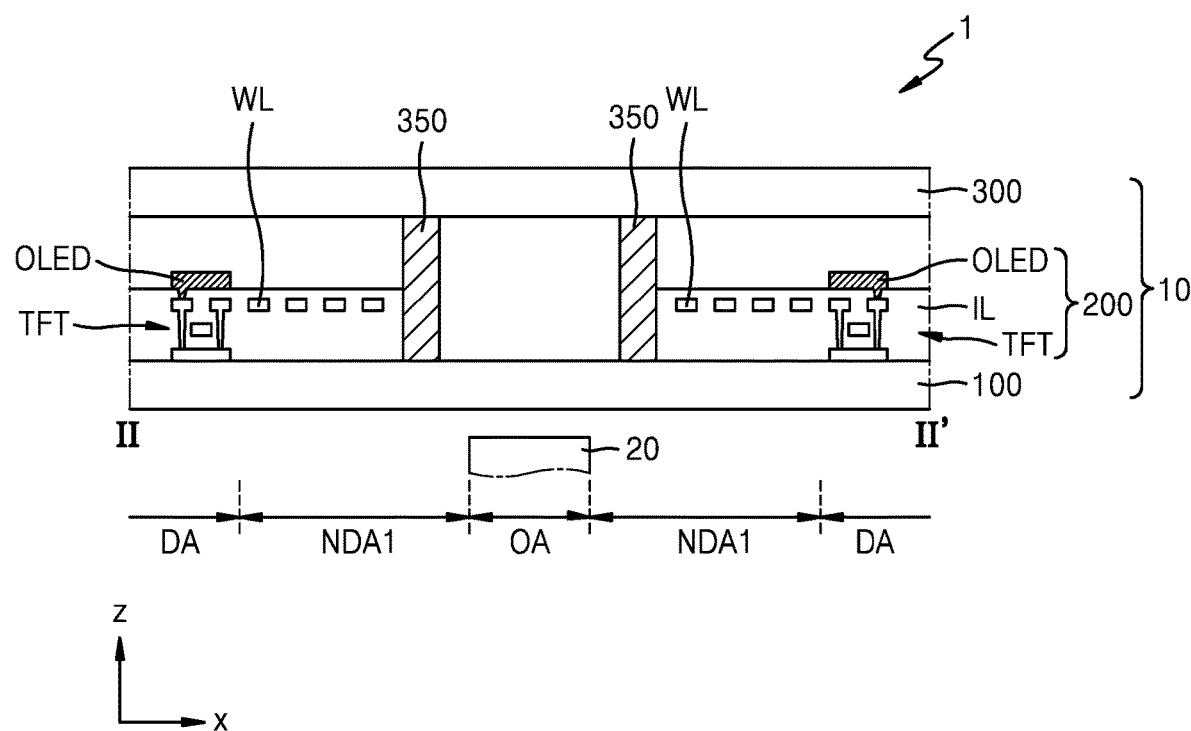
Figure 2D:
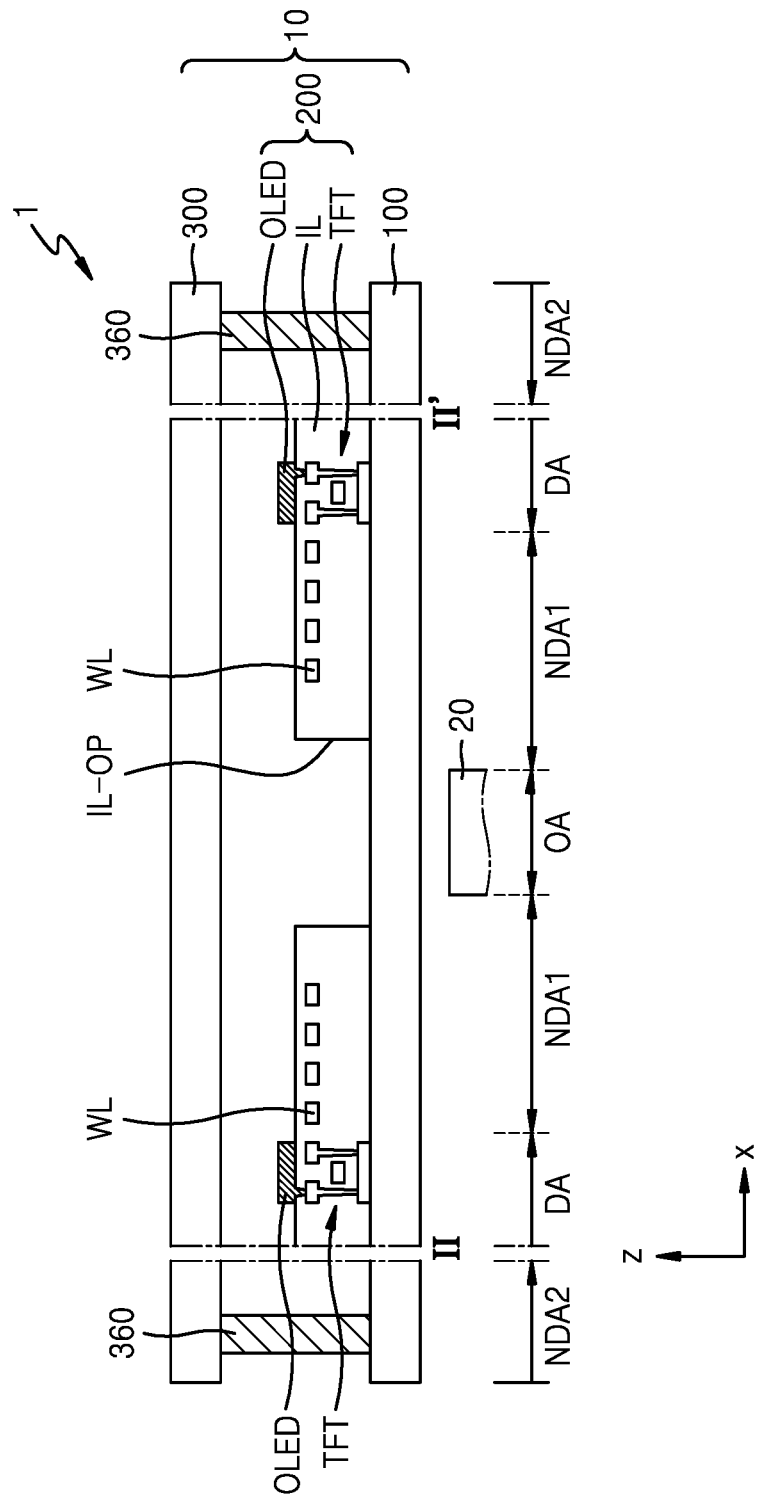

In some embodiments, as shown in FIGS. 2C and 2D, both the substrate 100 and the encapsulation substrate 300 may (e.g., simultaneously) not include the through holes corresponding to the opening area OA. As shown in FIG. 2C, the sealing material 350 may be arranged in the first non-display area NDA1 to surround the opening area OA.

In some embodiments, unlike in FIG. 2C, the sealing material 350 may not be provided around the opening area OA, as shown in FIG. 2D. A (second) sealing material 360 may be located in the second non-display area NDA2 and may seal the display element layer 200 from external air by bonding the substrate 100 to the encapsulation substrate 300. In some embodiments, the display device 1 of FIGS. 2A to 2C may also include the sealing material 360 that surrounds the display area DA.

The insulating layer IL of FIG. 2D may have an opening IL-OP corresponding to the opening area OA. In an embodiment, elements may not be arranged between the substrate 100 and the encapsulation substrate 300, and for example, no elements may correspond to or be positioned within the opening area OA. In another embodiment, a portion of one or more inorganic insulating layers (such as a buffer layer) may remain in the opening area OA of the substrate 100.

As shown in FIGS. 2B to 2D, even when the substrate 100 does not include the through hole 100H because portions of the display element layer 200 that correspond to the opening area OA are removed, a light transmittance of an electronic element may be secured or improved. In the case where the display device 1 includes the display panel 10 shown in FIGS. 2B to 2D, it may be suitable or possible to use an electronic element that uses (e.g., generates or receives) light.

Though it is shown in FIGS. 2A to 2D that the component 20 is located below the display panel 10, for example, located on one side of (e.g., below) the substrate 100, in some embodiments the component 20 may be at least partially inserted and located inside the through hole 10H so as to overlap lateral sides of the display panel 10 that define the through hole 10H in FIG. 2A.

In some embodiments, the component 20 may include another member besides the electronic element. In an embodiment, for example in the case where the display device 1 is used as a smartwatch or an instrument panel for an automobile, the component 20 may be a member such as clock hands or a needle indicating set or predetermined information (e.g. the velocity of a vehicle, etc.). In some embodiments, the component 20 may include an element such as an accessory that increases the aesthetic sense of the display panel 10.

Figure 3A:
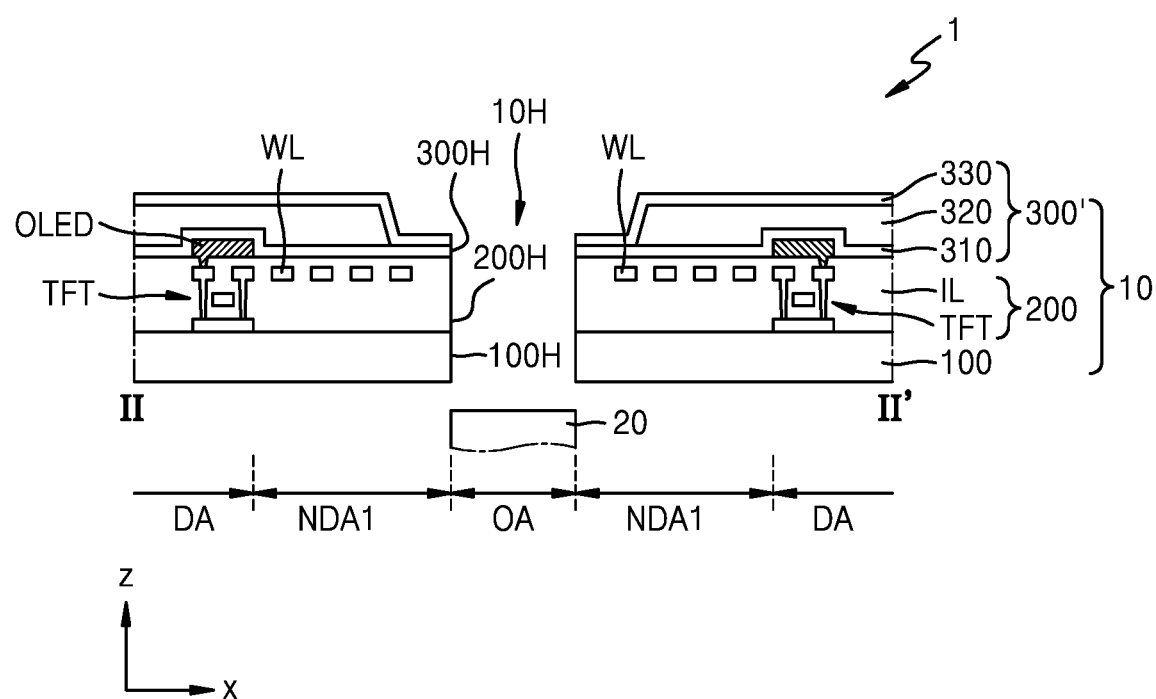
FIGS. 3A to 3C are cross-sectional views of a display device according to other embodiments, taken along line II-II' of FIG. 1.
Figure 3B:
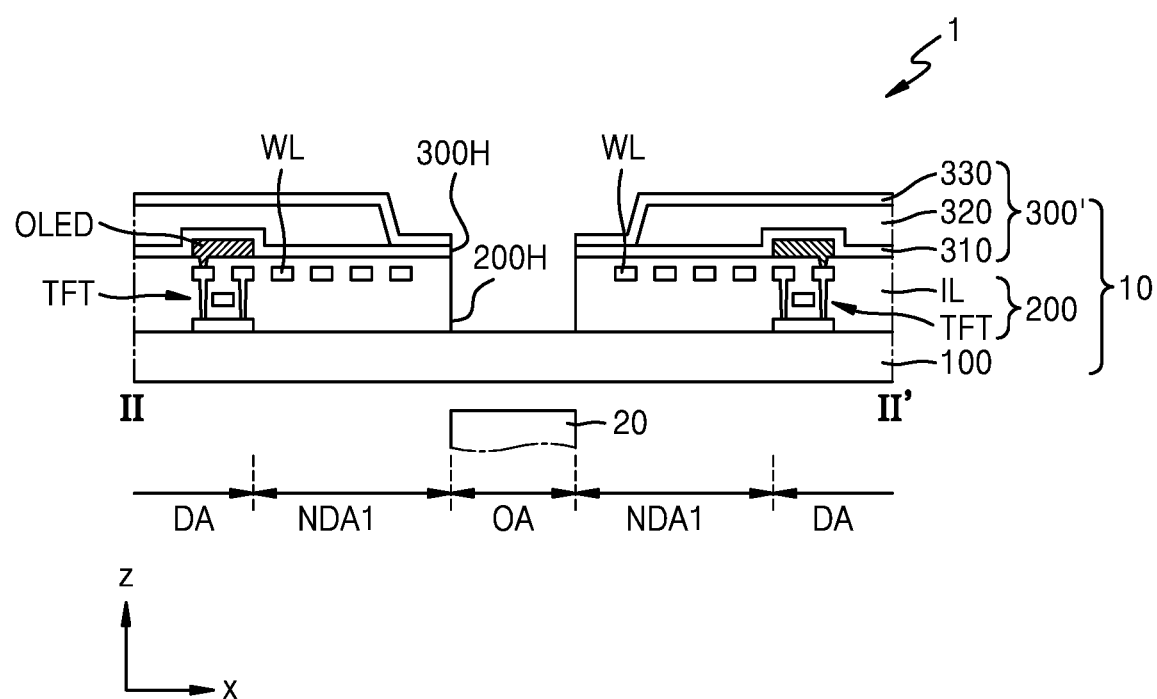
Figure 3C:
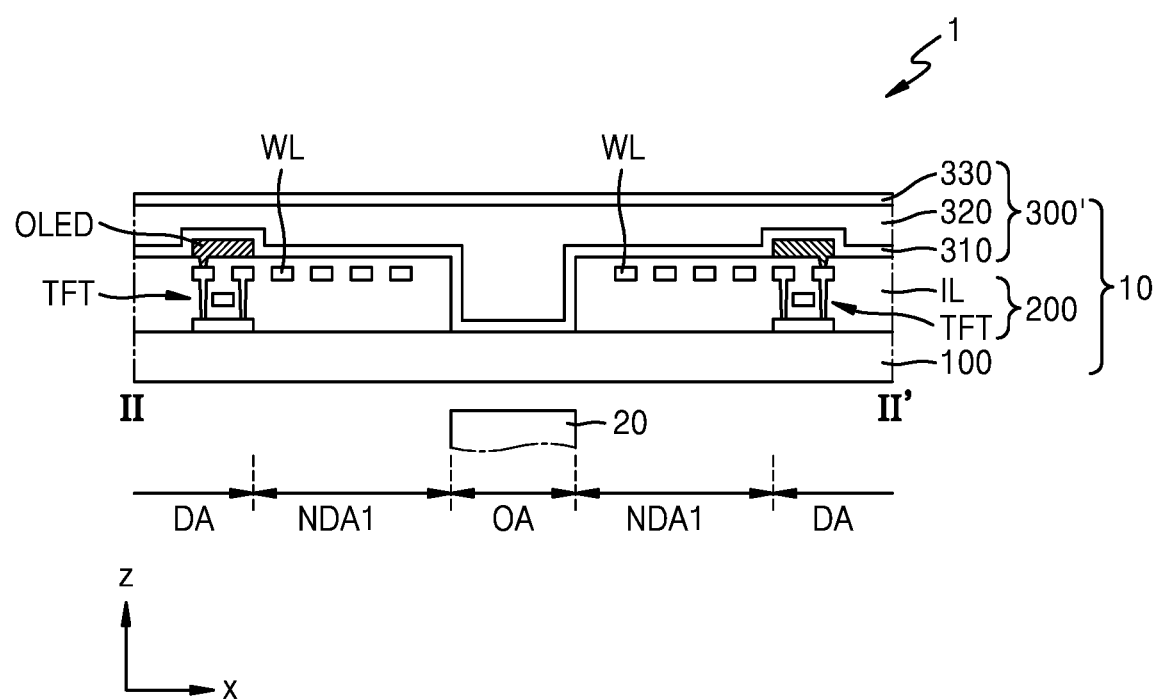

FIGS. 3A to 3C are cross-sectional views of the display device 1 according to other embodiments, taken along line II-II' of FIG. 1.

Referring to FIG. 3A, like the display device 1 described with reference to FIG. 2A, the display device 1 may include the display panel 10 and the component 20. In some embodiments, the display device 1 may further include an input sensing member sensing a touch input, a reflection prevention member, a window, etc. arranged on the display panel 10.

Unlike the display panel 10 including the encapsulation substrate 300 as an encapsulation member and the sealing material 350 described above with reference to FIG. 2A, the display panel 10 according to the present embodiment may include a thin-film encapsulation layer 300' as an encapsulation member. In this case, the flexibility of the display panel 10 may be further improved. Hereinafter, for convenience of description, the description will focus on differences with respect to previously-described embodiments.

The thin-film encapsulation layer 300' may include at least one inorganic encapsulation layer and at least one organic encapsulation layer. For example, FIG. 3A shows first and second inorganic encapsulation layers 310 and 330, and an organic encapsulation layer 320 therebetween.

The first and second encapsulation layers 310 and 330 may include at least one inorganic insulating material selected from aluminum oxide, titanium oxide, tantalum oxide, hafnium oxide, and zinc oxide, silicon oxide, silicon nitride, and silicon oxynitride. The organic encapsulation layer 320 may include a polymer-based material. The polymer-based material may include an acryl-based resin, an epoxy-based resin, polyimide, and/or polyethylene.

The display panel 10 may include the through hole 10H corresponding to the opening area OA. For example, the substrate 100, the display element layer 200, and the thin-film encapsulation layer 300' may respectively include through holes 100H, 200H, and 300H, each corresponding to the opening area OA. The first inorganic encapsulation layer 310, the second inorganic encapsulation layer 330, and the organic encapsulation layer 320 may each include holes corresponding to the opening area OA. A size of the hole of the organic encapsulation layer 320 may be greater than sizes of the holes of the first and second inorganic encapsulation layers 310 and 330. Therefore, the first inorganic encapsulation layer 310 may contact the second inorganic encapsulation layer 330 around the opening area OA.

Unlike the display panel 10 including the through hole 10H corresponding to the opening area OA in FIG. 3A, the display panel 10 may not include a through hole. As shown in FIG. 3B, the display element layer 200 and the thin-film encapsulation layer 300' may respectively include the through holes 200H and 300H corresponding to the opening area OA, but the substrate 100 may not include a through hole.

In some embodiments, as shown in FIG. 3C, each of the substrate 100, the display element layer 200, and the thin-film encapsulation layer 300' may not include through holes corresponding to the opening area OA. Even though the substrate 100 does not include the through hole 100H as shown in FIGS. 3B and 3C, portions of the display element layer 200 that correspond to the opening area OA may be removed and thus a light transmittance of the electronic element, which is the component 20, may be secured or improved.

In the case where the thin-film encapsulation layer 300' does not include the through hole, the at least one inorganic encapsulation layer and the at least one organic encapsulation layer may each cover a portion of the substrate 100 in the opening area OA. In this case, portions of the display element layer 200 that correspond to the opening area OA between the substrate 100 and the thin-film encapsulation layer 300' may be removed. Though FIG. 3A depicts an embodiment in which all of the insulating layer IL corresponding to the opening area OA is removed, in some embodiments only some layers of the multi-layered insulating layer IL may be removed.

Though FIGS. 3A to 3C depict embodiments in which the component 20 is located below the display panel 10, for example, located on one side of (e.g., below) the substrate 100, in some embodiments the component 20 may be at least partially inserted and located inside the through hole 10H so as to overlap lateral sides of the display panel 10 that define the through hole 10H in FIG. 3A.

Figure 4A:
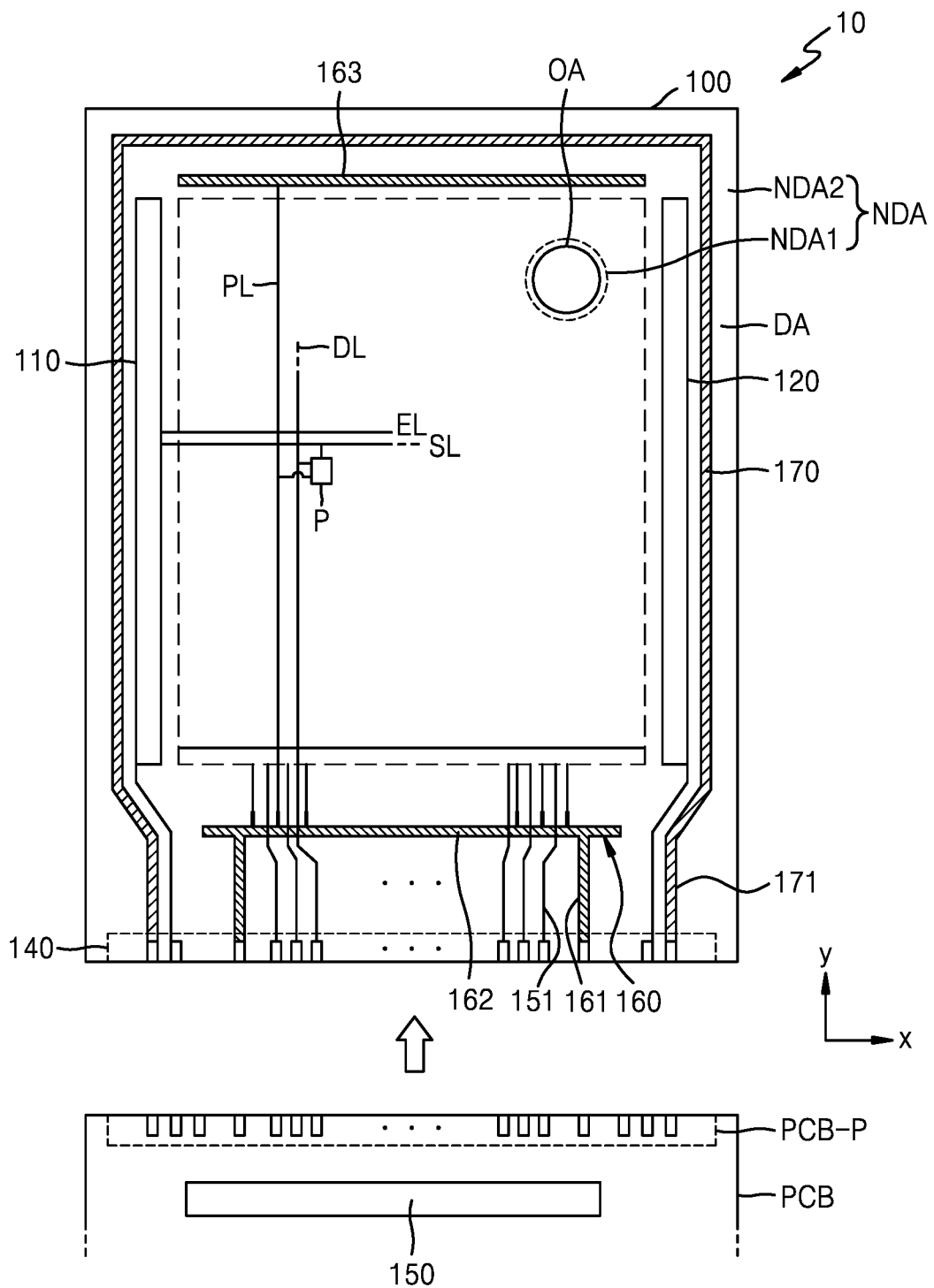
FIGS. 4A and 4B are plan views of a display panel according to an embodiment.
Figure 4B:
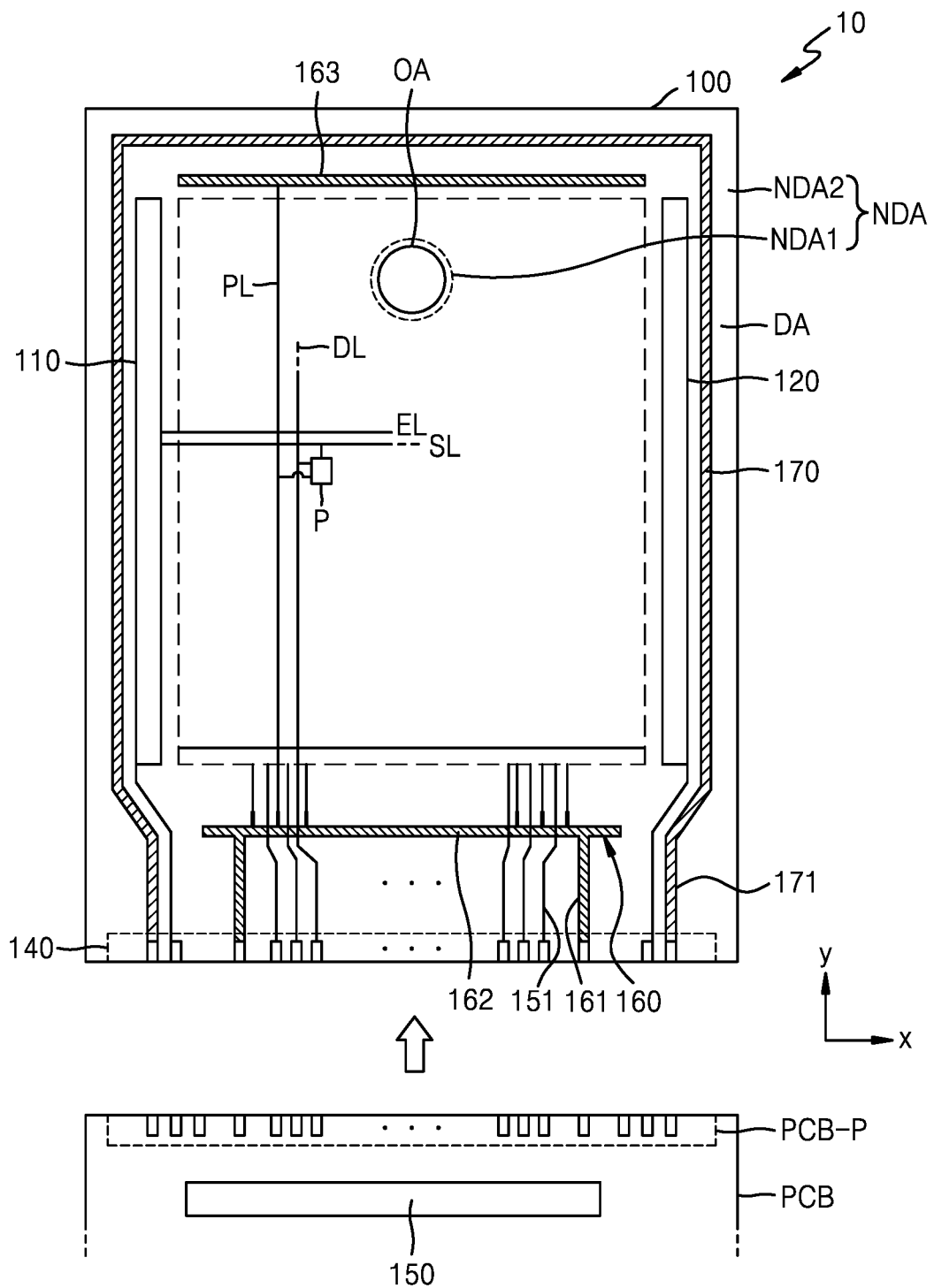

FIGS. 4A and 4B are plan views of the display panel 10 according to an embodiment.

Referring to FIGS. 4A-4B, the display panel 10 includes a plurality of pixels P arranged in the display area DA. Each pixel P may include a display element (such as an organic light-emitting diode). Each pixel P may emit, for example, red, green, blue, or white light from the organic light-emitting diode. In the present specification, a pixel P may be a sub-pixel that emits red, green, blue, or white light as described above. Because the display area DA is sealed by the encapsulation member described with reference to FIGS. 2A to 3C, the display area DA may be protected from external air or moisture, etc.

The opening area OA may be arranged inside or within the display area DA, and a plurality of pixels P may be arranged around the opening area OA. The plurality of pixels P may surround the opening area OA, and the first non-display area NDA1 may be located between the opening area OA and the display area DA, where the pixels P are not arranged within the first non-display area NDA1. Wiring lines may detour around the first non-display area NDA1 and may apply a set or predetermined signal or power to the pixels P spaced around the opening area OA. A relevant structure thereof is described below in connection with FIG. 8.

In some embodiments, as shown in FIG. 4A, the opening area OA may be arranged in an upper right end of the display area DA. In another embodiment, as shown in FIG. 4B, the opening area OA may be arranged in an upper central end of the display area DA. In another embodiment, the opening area OA may be arranged without limitation, such as in an upper left end, etc. of the display area DA, as long as the opening area OA is arranged inside (within) the display area DA.

Each pixel P may be electrically connected to outer circuits arranged in the non-display area, for example, the second non-display area NDA2. A first scan driving circuit 110, a second scan driving circuit 120, a terminal 140, a data driving circuit 150, a first power supply line 160, and a second power supply line 170 may be arranged in the second non-display area NDA2.

The first scan driving circuit 110 may supply a scan signal to each pixel P through a scan line SL. The first scan driving circuit 110 may provide an emission control signal to each pixel P through an emission control line EL. The second scan driving circuit 120 may be parallel to the first scan driving circuit 110 with the display area DA therebetween. Some of the pixels P arranged in the display area DA may be electrically connected to the first scan driving circuit 110, and the rest of the pixels P may be connected to the second scan driving circuit 120. In another embodiment, the second scan driving circuit 120 may be omitted.

The terminal 140 may be arranged on one side of the substrate 100. The terminal 140 may be exposed and electrically connected to a printed circuit board PCB by virtue of not being covered by an insulating layer. A terminal PCB-P of the printed circuit board PCB may be electrically connected to the terminal 140 of the display panel 10. The printed circuit board PCB transfers a signal of a controller or power to the display panel 10. Control signals generated by the controller may be respectively transferred to the first and second scan driving circuits 110 and 120 through the printed circuit board PCB. The controller may respectively provide first power ELVDD and second power ELVSS (see FIG. 5 below) to the first and second power supply lines 160 and 170 through first and second connection lines 161 and 171. The first power ELVDD (also referred to as a driving voltage) may be provided to each pixel P through a driving voltage line PL connected to the first power supply line 160, and the second power ELVSS (also referred to as a common voltage) may be provided to an opposite electrode of a pixel P that is connected to the second power supply line 170.

The data driving circuit 150 may be electrically connected to the data line DL. A data signal of the data driving circuit 150 may be provided to each pixel P through a connection line 151 connected to the terminal 140, and the data line DL connected to the connection line 151. Though FIG. 4 depicts an embodiment in which the data driving circuit 150 is arranged on the printed circuit board PCB, in some embodiments the data driving circuit 150 may be arranged on the substrate 100. In some embodiments, for example, the data driving circuit 150 may be between the terminal 140 and the first power supply line 160.

The first power supply line 160 may include a first sub-line 162 and a second sub-line 163 that are parallel to each other with the display area DA therebetween and extend in an x-direction. The second power supply line 170 may have a loop shape having one open side and partially surround the display area DA.

Figure 5:
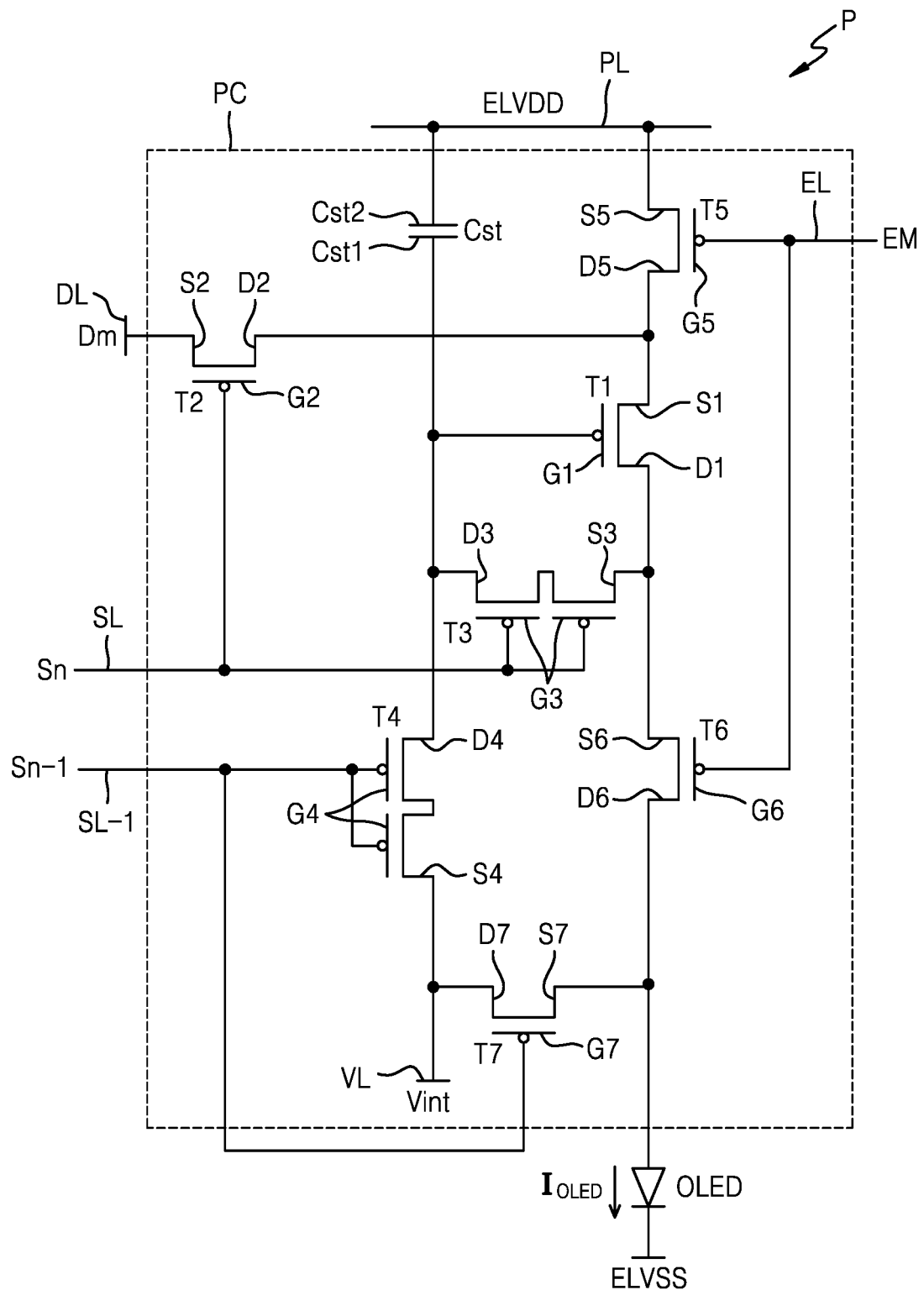
FIG. 5 is an equivalent circuit diagram of one of the pixels of a display panel according to an embodiment.

FIG. 5 is an equivalent circuit diagram of one of the pixels of the display panel 10 according to an embodiment.

Referring to FIG. 5, a pixel P may include a pixel circuit PC and an organic light-emitting diode OLED connected to the pixel circuit PC. The pixel circuit PC may include a plurality of thin film transistors and a storage capacitor. The plurality of thin film transistors and the storage capacitor may be connected to signal lines SL, SL-1, EL, and DL, an initialization voltage line VL, and a driving voltage line PL.

Though it is shown in FIG. 5 that each pixel P is independently connected to one set of the signal lines SL, SL-1, EL, and DL, the initialization voltage line VL, and the driving voltage line PL, embodiments are not limited thereto. In another embodiment, at least one of the signal lines SL, SL-1, EL, and DL, the initialization voltage line VL, and the driving voltage line PL may be shared by pixels that neighbor each other.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines may include the scan line SL, a previous scan line SL-1, the emission control line EL, and the data line DL. The scan line SL may transfer a scan signal Sn, the previous scan line SL-1 may transfer a previous scan signal Sn-1 to the first initialization thin film transistor T4 and the second initialization thin film transistor T7, the emission control line EL may transfer an emission control signal EM to the operation control thin film transistor T5 and the emission control thin film transistor T6, and the data line DL may intersect with (e.g., cross) the scan line SL and transfer a data signal Dm. The driving voltage line PL may transfers a driving voltage ELVDD to the driving thin film transistor T1, and the initialization voltage line VL may transfer an initialization voltage Vint to initialize the driving thin film transistor T1 and a pixel electrode of the organic light-emitting diode OLED.

A driving gate electrode G1 of the driving thin film transistor T1 may be connected to a first storage capacitor plate Cst1 of the storage capacitor Cst, a driving source electrode S1 of the driving thin film transistor T1 may be connected to the driving voltage line PL through the operation control thin film transistor T5, and a driving drain electrode D1 of the driving thin film transistor T1 may be electrically connected to the pixel electrode of an organic light-emitting diode OLED through the emission control thin film transistor T6. The driving thin film transistor T1 may receive a data signal Dm depending on a switching operation of the switching thin film transistor T2, and may supply a driving current IDLED to the organic light-emitting diode OLED.

A switching gate electrode G2 of the switching thin film transistor T2 may be connected to the scan line SL, a switching source electrode S2 of the switching thin film transistor T2 may be connected to the data line DL, and a switching drain electrode D2 of the switching thin film transistor T2 may be connected to the driving source electrode S1 of the driving thin film transistor T1 and concurrently (e.g., simultaneously) connected to the driving voltage line PL through the operation control thin film transistor T5. The switching thin film transistor T2 may be turned on in response to a scan signal Sn transferred through the scan line SL, and may perform a switching operation of transferring a data signal Dm transferred through the data line DL to the driving source electrode S1 of the driving thin film transistor T1.

A compensation gate electrode G3 of the compensation thin film transistor T3 may be connected to the scan line SL, a compensation source electrode S3 of the compensation thin film transistor T3 may be connected to the driving drain electrode D1 of the driving thin film transistor T1 and concurrently (e.g., simultaneously) connected to the pixel electrode of the organic light-emitting diode OLED through the emission control thin film transistor T6, and a compensation drain electrode D3 of the compensation thin film transistor T3 may be connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 may be turned on in response to a scan signal Sn transferred through the scan line SL, and may diode-connect the driving thin film transistor T1 by electrically connecting the driving gate electrode G1 to the driving drain electrode D1 of the driving thin film transistor T1.

A first initialization gate electrode G4 of the first initialization thin film transistor T4 may be connected to the previous scan line SL-1, a first initialization source electrode S4 of the first initialization thin film transistor T4 may be connected to a second initialization drain electrode D7 of the second initialization thin film transistor T7 and the initialization voltage line VL, and a first initialization drain electrode D4 of the first initialization thin film transistor T4 may be connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 may be turned on in response to a previous scan signal Sn-1 transferred through the previous scan line SL-1, and may transfer an initialization voltage Vint to the driving gate electrode G1 of the driving thin film transistor T1, thereby performing an initialization operation of initializing a voltage of the driving gate electrode G1 of the driving thin film transistor T1.

An operation control gate electrode G5 of the operation control thin film transistor T5 may be connected to the emission control line EL, an operation control source electrode S5 of the operation control thin film transistor T5 may be connected to the driving voltage line PL, and an operation control drain electrode D5 of the operation control thin film transistor T5 may be connected to the driving source electrode S1 of the driving thin film transistor T1 and the switching drain electrode D2 of the switching thin film transistor T2.

An emission control gate electrode G6 of the emission control thin film transistor T6 may be connected to the emission control line EL, an emission control source electrode S6 of the emission control thin film transistor T6 may be connected to the driving drain electrode D1 of the driving thin film transistor T1 and the compensation source electrode S3 of the compensation thin film transistor T3, and an emission control drain electrode D6 of the emission control thin film transistor T6 may be connected to the second initialization source electrode S7 of the second initialization thin film transistor T7 and the pixel electrode of the organic light-emitting diode OLED.

The operation control thin film transistor T5 and the emission control thin film transistor T6 may be concurrently (e.g., simultaneously) turned on in response to an emission control signal EM transferred through the emission control line EL to thereby allow the driving voltage ELVDD to be transferred to the organic light-emitting diode OLED, such that the driving current IDLED flows through the organic light-emitting diode OLED.

A second initialization gate electrode G7 of the second initialization thin film transistor T7 may be connected to the previous scan line SL-1, the second initialization source electrode S7 of the second initialization thin film transistor T7 may be connected to the emission control drain electrode D6 of the emission control thin film transistor T6 and the pixel electrode of the organic light-emitting diode OLED, and the second initialization drain electrode D7 of the second initialization thin film transistor T7 may be connected to the first initialization source electrode S4 of the first initialization thin film transistor T4 and the initialization voltage line VL. The second initialization thin film transistor T7 may be turned on in response to a previous scan signal Sn-1 transferred through the previous scan line SL-1, and may thereby initialize the pixel electrode of the organic light-emitting diode OLED.

Though FIG. 5 shows the case where the first initialization thin film transistor T4 and the second initialization thin film transistor T7 are connected to the previous scan line SL-1, embodiments are not limited thereto. In another embodiment, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A second storage capacitor plate Cst2 of the storage capacitor Cst may be connected to the driving voltage line PL, and an opposite electrode of the organic light-emitting diode OLED may be connected to a common voltage ELVSS. Therefore, the organic light-emitting diode OLED may receive the driving current IDLED from the driving thin film transistor T1 and emit light to thereby display an image.

Though FIG. 5 depicts an embodiment in which the compensation thin film transistor T3 and the first initialization thin film transistor T4 each have a dual gate electrode, in some embodiments the compensation thin film transistor T3 and the first initialization thin film transistor T4 may each have one gate electrode.

Figure 6A:
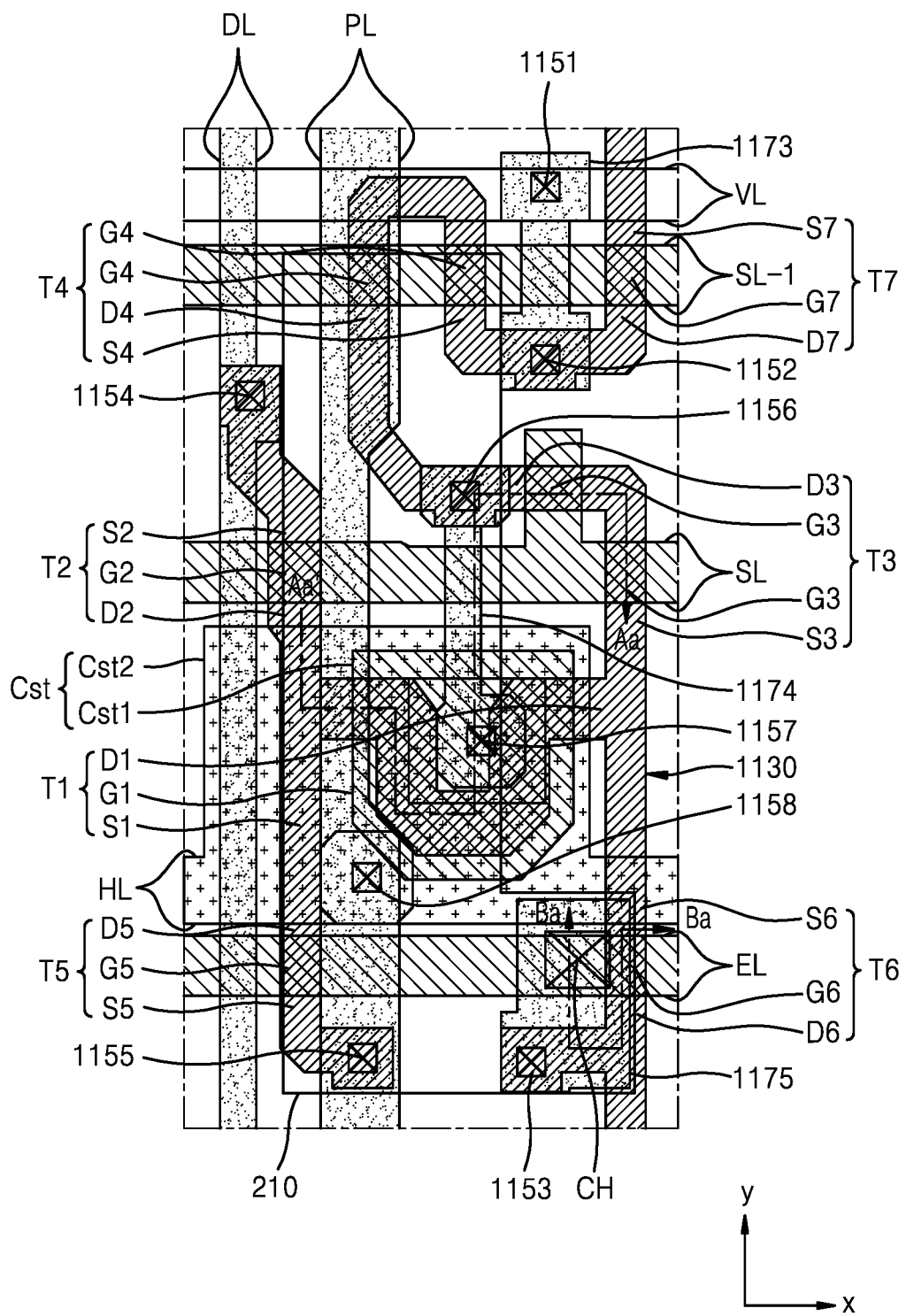
FIGS. 6A and 6B are plan views of one of the pixels of a display panel according to an embodiment.
Figure 6B:
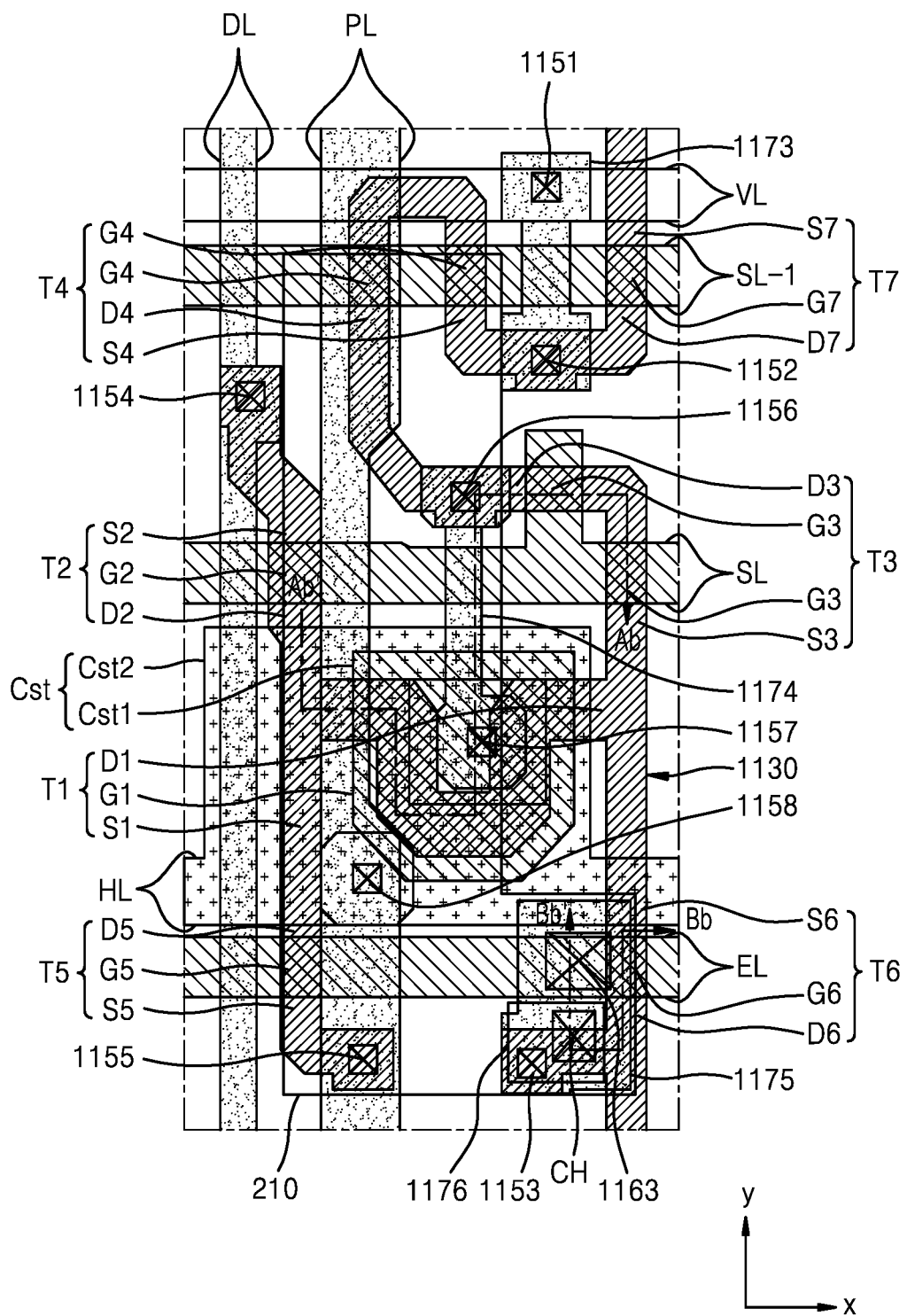
Figure 7A:
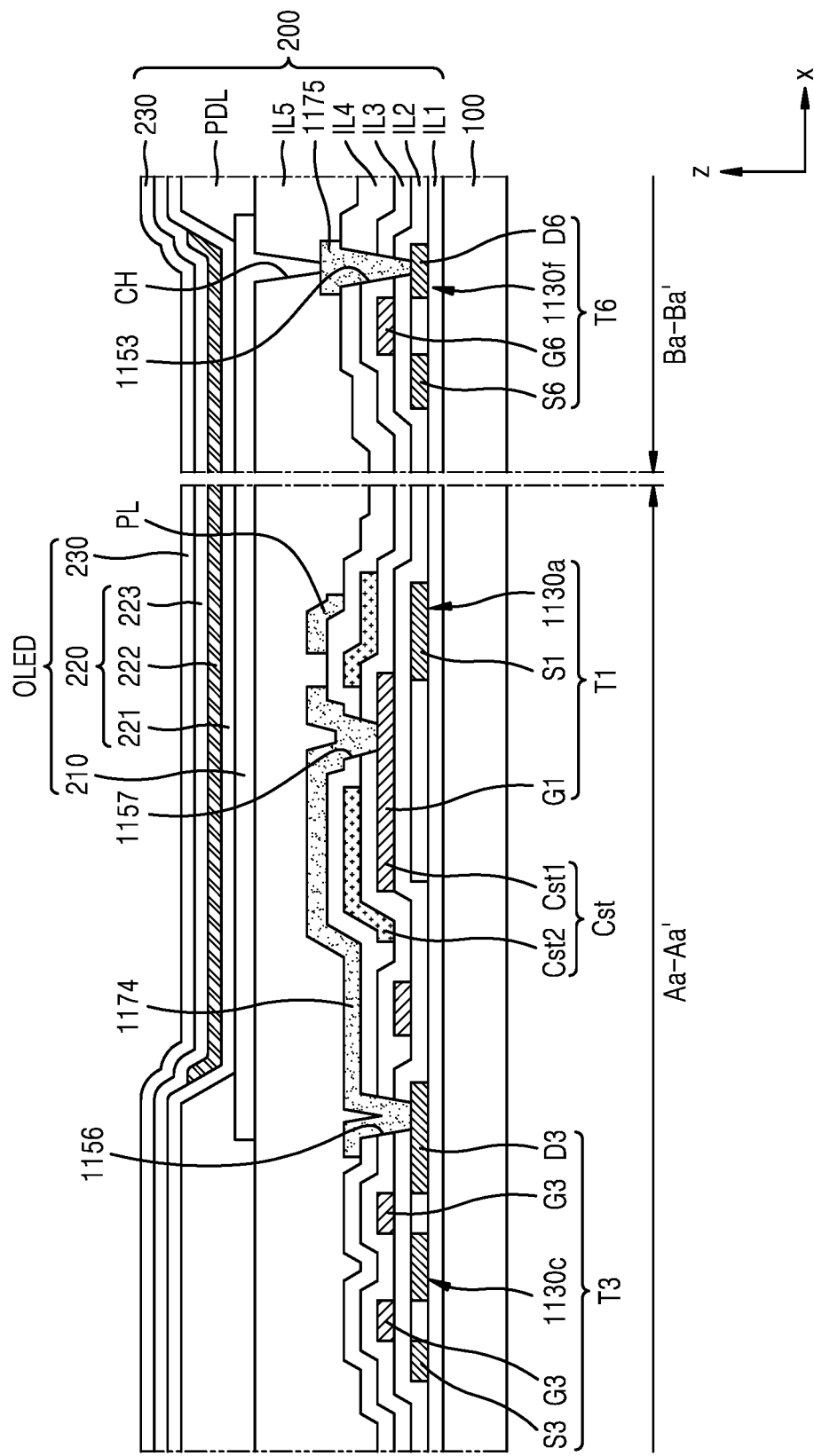
FIG. 7A is a cross-sectional view of a pixel taken along lines Aa-Aa' and Ba-Ba' of FIG. 6A.
Figure 7B:
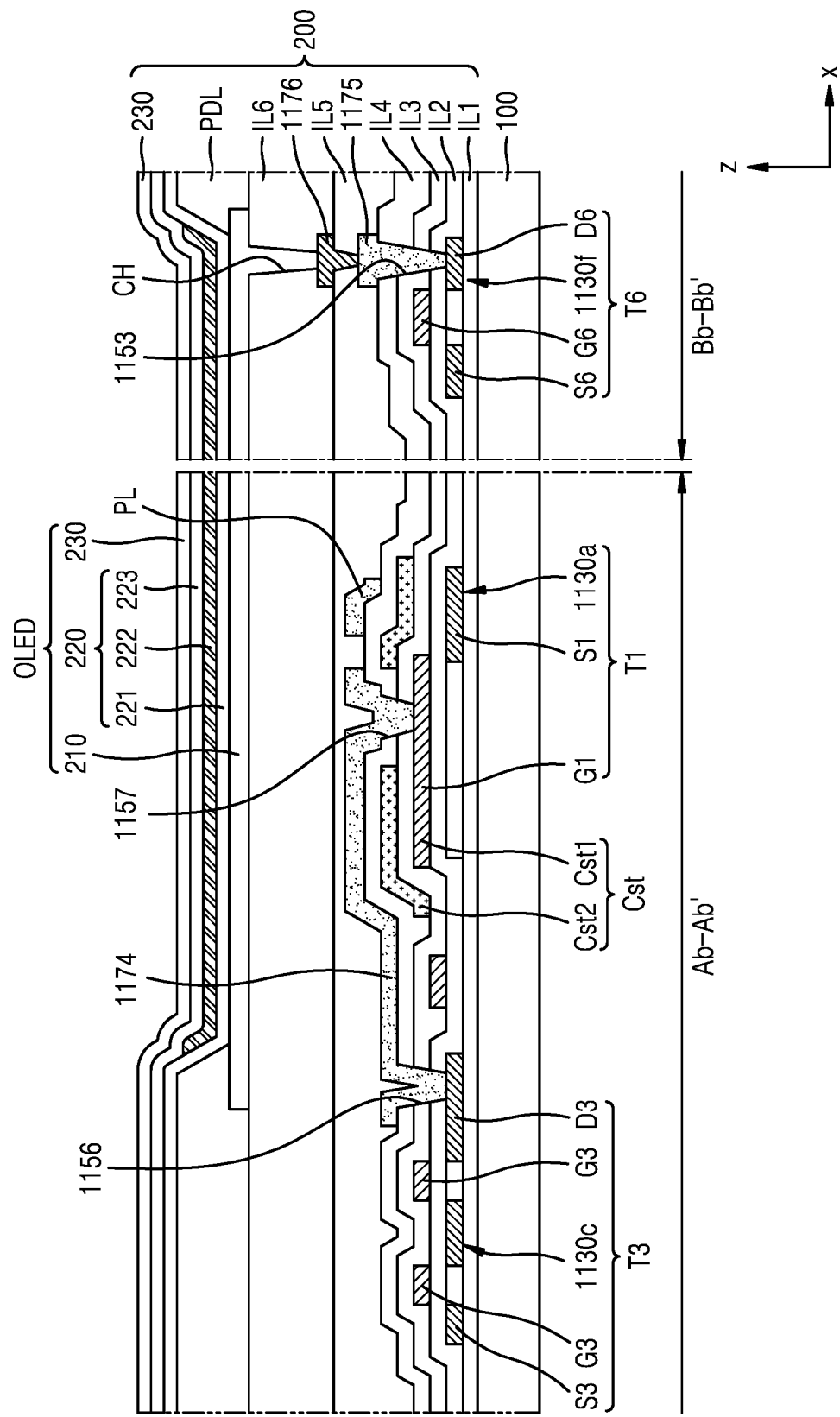
FIG. 7B is a cross-sectional view of a pixel taken along lines Ab-Ab' and Bb-Bb' of FIG. 6B.

FIGS. 6A and 6B are plan views of a single pixel of the display panel 10 according to an embodiment, FIG. 7A is a cross-sectional view of the pixel taken along lines Aa-Aa' and Ba-Ba' of FIG. 6A, and FIG. 7B is a cross-sectional view of the pixel taken along lines Ab-Ab' and Bb-Bb' of FIG. 6B.

Referring to FIGS. 6A and 7A, the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be arranged along a semiconductor layer 1130. As shown in FIGS. 7A-7B, the semiconductor layer 1130 may be located over the substrate 100. A buffer layer IL1 may be formed under the semiconductor layer 1130, the buffer layer IL1 including an inorganic material (such as silicon oxide, silicon nitride, and/or silicon oxynitride).

Some (different, set) regions of the semiconductor layer 1130 may correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and/or the second initialization thin film transistor T7. In other words, the semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 may be connected to each other and may have a shape bent in various directions.

FIGS. 7A and 7B show a driving semiconductor layer 1130a of the driving thin film transistor T1, a compensation semiconductor layer 1130c of the compensation thin film transistor T3, and an emission control semiconductor layer 1130f of the emission control thin film transistor T6, each corresponding to different regions of the semiconductor layer 1130.

The semiconductor layer 1130 may include a channel region, a source region, and a drain region for each transistor, the source region and the drain region being on two opposite sides of the channel region. The source region and the drain region may respectively correspond to a source electrode and a drain electrode of a relevant thin film transistor. Hereinafter, for convenience of description, a source region and a drain region are respectively referred to as a source electrode and a drain electrode.

The driving thin film transistor T1 includes the driving gate electrode G1, the driving source electrode S1, and the driving drain electrode D1, the driving gate electrode G1 overlapping a driving channel region, and the driving source electrode S1 and the driving drain electrode D1 being on two opposite sides of the driving channel region. The driving channel region overlapping the driving gate electrode G1 may have a long channel length in a narrow space by having a structure bent in various suitable shapes. In the case where a length of the driving channel region is long, a driving range of a gate voltage may widen, and gradation of light emitted from an organic light-emitting diode OLED may be more easily controlled, such that the display quality may be improved.

The switching thin film transistor T2 may include the switching gate electrode G2, the switching source electrode S2, and the switching drain electrode D2, the switching gate electrode G2 overlapping a switching channel region, and the switching source electrode S2 and the switching drain electrode D2 being on two opposite sides of the switching channel region. The switching drain electrode D2 may be connected to the driving source electrode S1.

The compensation thin film transistor T3 may be a dual thin film transistor and may include compensation gate electrodes G3, the compensation source electrode S3, and the compensation drain electrode D3, the compensation gate electrodes G3 overlapping two compensation channel regions, and the compensation source electrode S3 and the compensation drain electrode D3 being on two opposite sides of the compensation channel region. The compensation thin film transistor T3 may be connected to the driving gate electrode G1 of the driving thin film transistor T1 through a node connection line 1174 described below.

The first initialization thin film transistor T4 may be a dual thin film transistor and may include the first initialization gate electrodes G4, the first initialization source electrode S4, and the first initialization drain electrode D4, the first initialization gate electrodes G4 overlapping two first initialization channel regions, and the first initialization source electrode S4 and the first initialization drain electrode D4 being on two opposite sides of the first initialization channel region.

The operation control thin film transistor T5 may include the operation control gate electrode G5, the operation control source electrode S5, and the operation control drain electrode D5, the operation control gate electrode G5 overlapping an operation control channel region, and the operation control source electrode S5 and the operation control drain electrode D5 being on two opposite sides of the operation control channel region. The operation control drain electrode D5 may be connected to the driving source electrode S1.

The emission control thin film transistor T6 may include the emission control gate electrode G6, the emission control source electrode S6, and the emission control drain electrode D6, the emission control gate electrode G6 overlapping an emission control channel region, and the emission control source electrode S6 and the emission control drain electrode D6 being on two opposite sides of the emission control channel region. The emission control source electrode S6 may be connected to the driving drain electrode D1.

The second initialization thin film transistor T7 may include the second initialization gate electrode G7, the second initialization source electrode S7, and the second initialization drain electrode D7, the second initialization gate electrode G7 overlapping a second initialization channel region, and the second initialization source electrode S7 and the second initialization drain electrode D7 being on two opposite sides of the second initialization channel region.

The above-described thin film transistors may be connected to the signal lines SWL, SIL, EL, and/or DL, the initialization voltage line VL, and/or the driving voltage line PL.

A gate insulating layer IL2 (see FIG. 7A) may be arranged on the semiconductor layer 1130. The scan line SL, the previous scan line SL-1, the emission control line EL, and the driving gate electrode G1 may be arranged on the gate insulating layer IL2. The gate insulating layer IL2 may include an inorganic material (such as silicon oxide, silicon nitride, and/or silicon oxynitride). The scan line SL, the previous scan line SL-1, the emission control line EL, and the driving gate electrode G1 may each independently include a metal (such as molybdenum (Mo), aluminum (Al), copper (Cu), titanium (Ti), and/or an alloy thereof).

The scan line SL may extend in the x-direction. Some regions of the scan line SL may respectively correspond to the switching and compensation gate electrodes G2 and G3. For example, regions of the scan line SL that overlap the switching and compensation thin film transistors T2 and T3 may be (e.g., correspond to) the switching and compensation gate electrodes G2 and G3, respectively.

The previous scan line SL-1 may extend in the x-direction, and some regions of the previous scan line SL-1 may respectively correspond to the first and second initialization gate electrodes G4 and G7. For example, regions of the previous scan line SL-1 that overlap the channel regions of the first and second initialization thin film transistors T4 and T7 may be (e.g., correspond to) the first and second initialization gate electrodes G4 and G7, respectively.

The emission control line EL may extend in the x-direction. Some regions of the emission control line EL may respectively correspond to the operation control and emission control gate electrodes G5 and G6. For example, regions of the emission control line EL that overlap the channel regions of the operation control and emission control thin film transistors T6 and T7 may be (correspond to) the operation control and emission control gate electrodes G5 and G6, respectively.

The driving gate electrode G1 may be a floating electrode, and may be connected to the compensation thin film transistor T3 through the node connection line 1174.

The initialization voltage line VL may extend in the x-direction. The initialization voltage line VL may be connected to the first and second initialization thin film transistors T4 and T7 through an initialization connection line 1173.

Though FIG. 6A depicts an embodiment in which the initialization voltage line VL is arranged on a first planarization insulating layer IL5, such that the initialization voltage line VL is arranged on the same layer as a layer on which the pixel electrode 210 is arranged, in some embodiments the initialization voltage line VL may be arranged on the gate insulating layer IL2 so as to include the same material as those of the scan line SL, the previous scan line SL-1, the emission control line EL, and the driving gate electrode G1.

In another embodiment, as shown in FIG. 6B, the initialization voltage line VL may be arranged on the first planarization insulating layer IL5 so that the initialization voltage line VL is on the same layer as a contact metal 1176. In this case, the pixel electrode 210 is arranged on a second planarization layer IL6 as shown in FIG. 7B.

In some embodiments, an electrode voltage line HL may be arranged over the scan line SL, the previous scan line SL-1, the emission control line EL, and the driving gate electrode G1 with a first interlayer insulating layer IL3 (see FIG. 7A) including an inorganic material therebetween.

As shown in FIG. 6A, the electrode voltage line HL may extend in the x-direction so as to intersect with (e.g., cross) the data line DL and the driving voltage line PL. A portion of the electrode voltage line HL may cover at least a portion of the driving gate electrode G1 and may constitute the storage capacitor Cst in cooperation with the driving gate electrode G1. For example, the driving gate electrode G1 may serve as the first storage capacitor plate Cst1 (for example, a bottom electrode) of the storage capacitor Cst, and a portion of the electrode voltage line HL may serve as the second storage capacitor plate Cst2 (for example, a top electrode) of the storage capacitor Cst.

The driving voltage line PL and the second storage capacitor plate Cst2 may be electrically connected to the driving voltage line PL. For example, it is shown in FIG. 6A that the electrode voltage line HL is connected to the driving voltage line PL arranged on the electrode voltage line HL through a contact hole 1158. The electrode voltage line HL may have the same voltage level (a constant voltage, e.g., +5V) as the driving voltage line PL. It may be understood that the electrode voltage line HL is a kind of a driving voltage line in a transverse direction.

Because the driving voltage line PL extends in the y-direction, and the electrode voltage line HL electrically connected to the driving voltage line PL extends in the x-direction intersecting with (e.g., crossing) the y-direction, a plurality of driving voltage lines PL and electrode voltage lines HL may constitute a mesh structure in the display area DA.

The data line DL, the driving voltage line PL, the initialization connection line 1173, and the node connection line 1174 may each be arranged on (e.g., over) the second storage capacitor plate Cst2 and the electrode voltage line HL, with a second insulating layer IL4 (see FIG. 7A) including an inorganic material therebetween. The data line DL, the driving voltage line PL, the initialization connection line 1173, and the node connection line 1174 may each be or include a single layer or a multi-layer structure including aluminum (Al), copper (Cu), and/or titanium (Ti). In an embodiment, for example, the driving voltage line PL and the data line DL may have a multi-layered structure of Ti/Al/Ti.

The data line DL may extend in the y-direction and may be connected to the switching source electrode S2 of the switching thin film transistor T2 through a contact hole 1154. A portion of the data line DL may be the switching source electrode S2 (for example, an electrode layer).

The driving voltage line PL may extend in the y-direction and may be connected to the electrode voltage line HL through the contact hole 1158 as described above. Also, the driving voltage line PL may be connected to the operation control thin film transistor T5 through a contact hole 1155. The driving voltage line PL may be connected to the operation control drain electrode D5 through the contact hole 1155.

One end of the initialization connection line 1173 may be connected to the first and second initialization thin film transistors T4 and T7 through a contact hole 1152, and the other end of the initialization connection line 1173 may be connected to the initialization voltage line VL through a contact hole 1151.

One end of the node connection line 1174 may be connected to the compensation drain electrode D3 through a contact hole 1156, and the other end of the node connection line 1174 may be connected to the driving gate electrode G1 through a contact hole 1157.

The first planarization insulating layer IL5 including an organic insulating material may be located on the data line DL, the driving voltage line PL, the initialization connection line 1173, and the node connection line 1174. The pixel electrode 210 may be arranged on the first planarization insulating layer IL5.

The pixel electrode 210 may be connected to the emission control thin film transistor T6. The pixel electrode 210 may be connected to a connection metal 1175 through a contact hole CH, and the connection metal 1175 may be connected to the emission control drain electrode D6 through a contact hole 1153.

In another embodiment, as shown in FIGS. 6B and 7B, the first planarization insulating layer IL5 and the second planarization insulating layer IL6 may be located on the data line DL, the driving voltage line PL, the initialization connection line 1173, the node connection line 1174, and the connection metal 1175. In this case, a contact metal 1176 may be located on the first planarization insulating layer IL5, and the pixel electrode 210 may be arranged on the second planarization insulating layer IL6. In this case, the initialization voltage line VL may be arranged on the same layer as a layer on which the contact metal 1176 is arranged, and may include the same material as that of the contact metal CM.

The pixel electrode 210 may be connected to the emission control thin film transistor T6. The pixel electrode 210 may be connected to the contact metal CM through the contact hole CH, the contact metal CM may be connected to the connection metal 1175 through a contact hole 1163, and the connection metal 1175 may be connected to the emission control drain electrode D6 through the contact hole 1153.

Referring to FIG. 7A, edges of the pixel electrode 210 may be covered by a pixel-defining layer PDL on the first planarization insulating layer IL5, and a central region of the pixel electrode 210 may be exposed through an opening of the pixel-defining layer PDL. The pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof. In another embodiment, the pixel electrode 210 may further include a layer including indium tin oxide (ITO), indium zinc oxide (IZO), zinc oxide (ZnO), and/or indium oxide ($In_2O_3$) on/under the reflective layer. An intermediate layer 220 may be arranged on a portion of the pixel electrode 210 that is exposed through the opening of the pixel-defining layer PDL.

The intermediate layer 220 may include an emission layer 222 on the portion of the pixel electrode 210 that is exposed through the opening of the pixel-defining layer PDL. The emission layer 222 may include a polymer organic material and/or a low molecular weight organic material emitting light of a set or predetermined color. In an embodiment, as shown in FIG. 7A, the intermediate layer 220 may include a first functional layer 221 under the emission layer 222 and/or a second functional layer 223 on the emission layer 222.

The first functional layer 221 may be or include a single layer or a multi-layer structure. For example, in the case where the first functional layer 221 includes a polymer material, the first functional layer 221 may be a hole transport layer (HTL), which has a single-layered structure. The first functional layer 221 may include poly-(3, 4)-ethylene-dihydroxy thiophene (PEDOT) or polyaniline (PANI). In the case where the first functional layer 221 includes a low molecular weight organic material, the first functional layer 221 may include a hole injection layer (HIL) and a hole transport layer (HTL).

In some embodiments, the second functional layer 223 may be omitted. In some embodiments, for example, in the case where the first functional layer 221 and the emission layer 222 include a polymer material the second functional layer 223 may be formed to improve the characteristics of the organic light-emitting diode OLED. The second functional layer 223 may include a single layer or a multi-layer structure. The second functional layer 223 may include an electron transport layer (ETL) and/or an electron injection layer (EIL).

An opposite electrode 230 may face the pixel electrode 210 with the intermediate layer 220 therebetween. The opposite electrode 230 may include a conductive material having a low work function. For example, the opposite electrode 230 may include a (semi) transparent layer including Ag, Mg, Al, Pt, Pd, Au, Ni, Nd, Ir, Cr, lithium (Li), calcium (Ca), and/or an alloy thereof. The opposite electrode 230 may further include a layer including ITO, IZO, ZnO, and/or $In_2O_3$ on/under the (semi) transparent layer including the above material.

In some embodiments, the display element layer 200, for example, including the layers from the buffer layer IL1 to the opposite electrode 230, may be arranged on the substrate 100 and may be covered by the encapsulation member described above in connection with FIGS. 3A to 4C.

Figure 8:
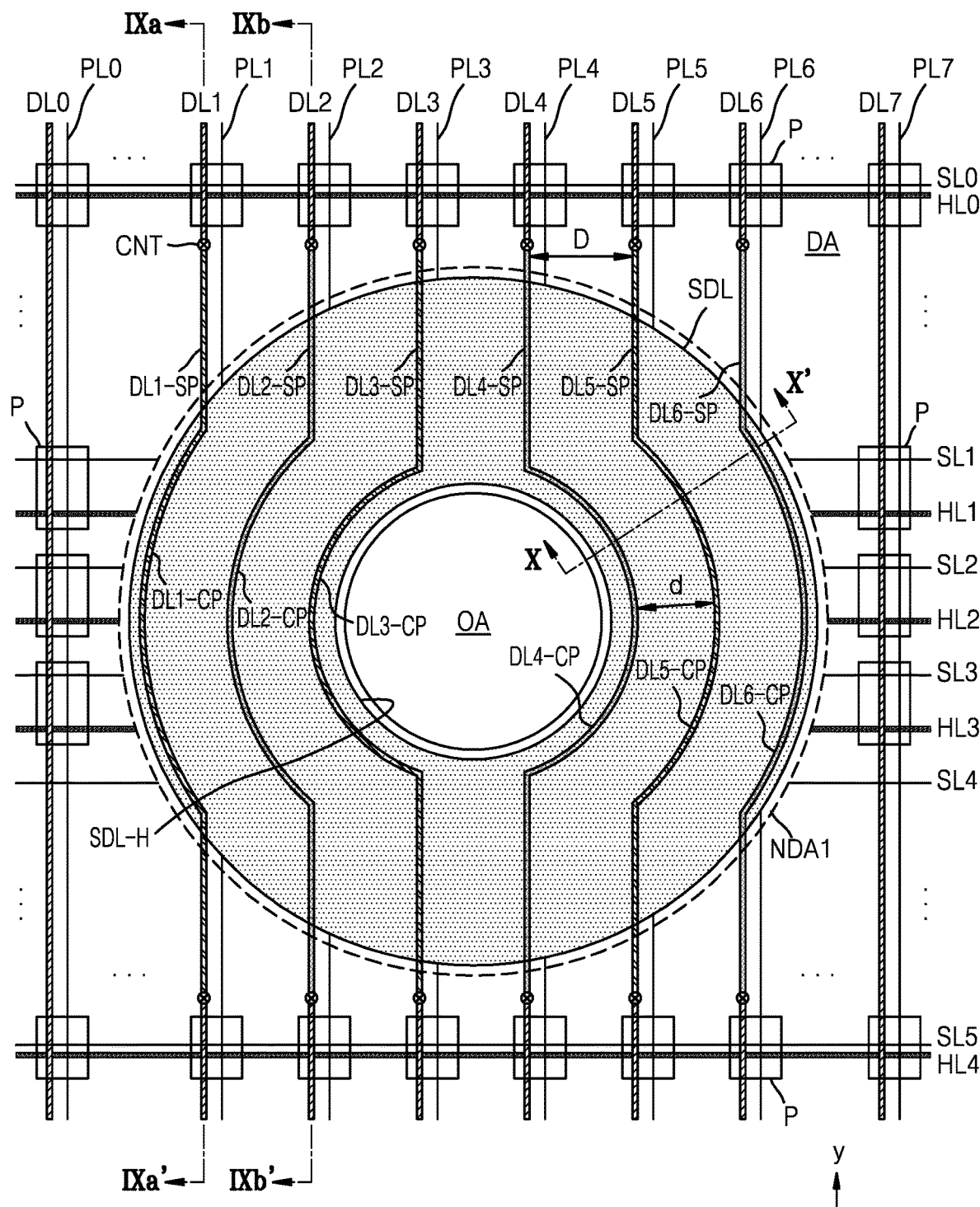
FIG. 8 is a plan view of wirings around an transmission area according to an embodiment.
Figure 9A:
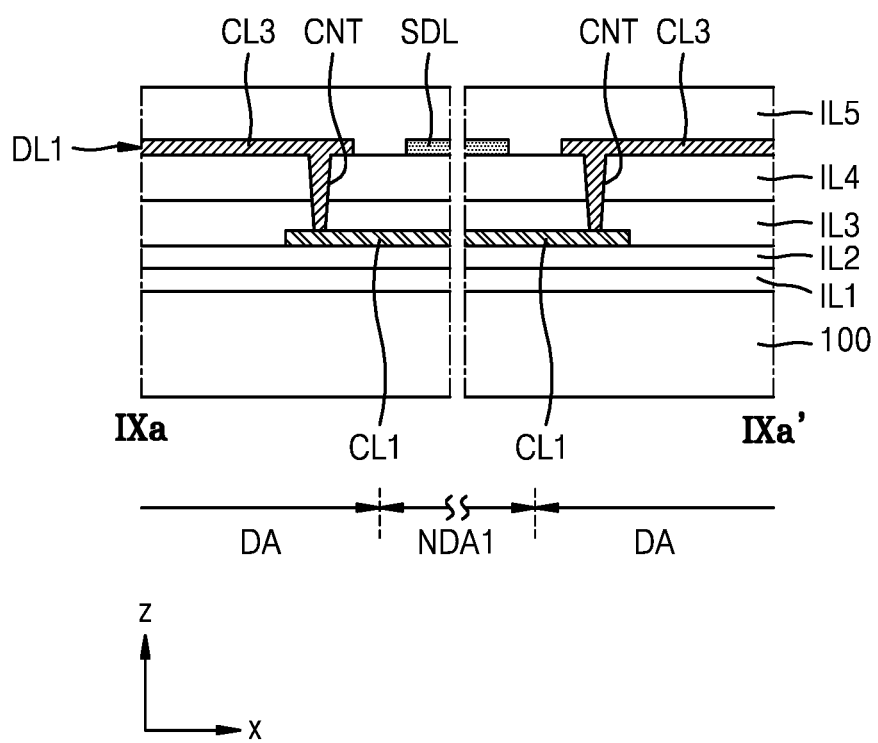
FIG. 9A is a cross-sectional view of a wiring taken along line IXa-IXa' of FIG. 8.
Figure 9B:
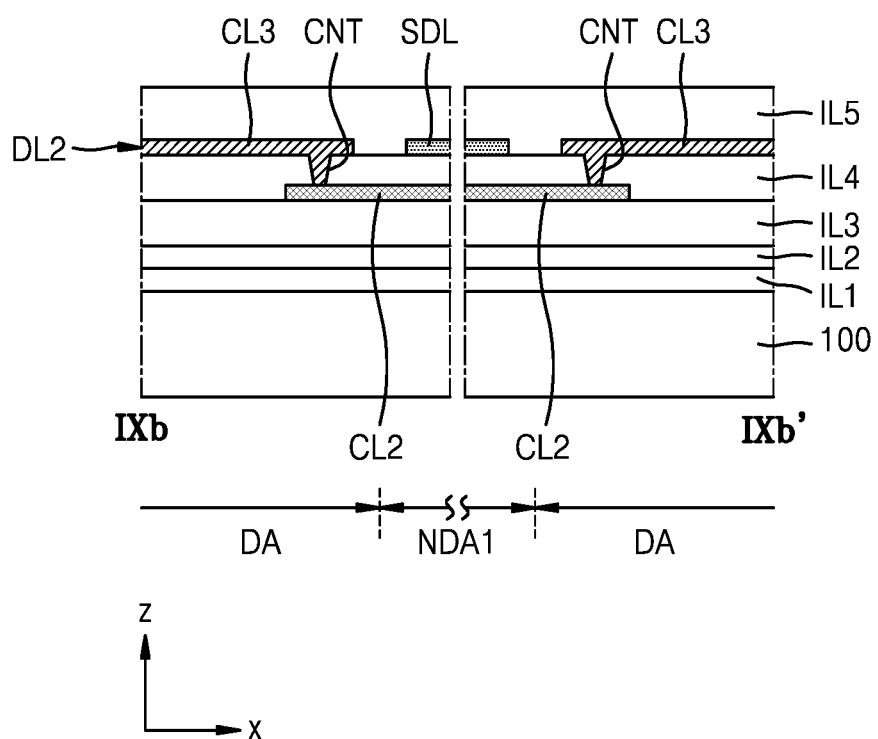
FIG. 9B is a cross-sectional view of a wiring taken along line IXb-IXb' of FIG. 8.

FIG. 8 is a plan view depicting wirings (e.g., a wiring layout) around the opening area OA according to an embodiment, FIG. 9A is a cross-sectional view of the wiring taken along line IXa-IXa' of FIG. 8, and FIG. 9B is a cross-sectional view of the wiring taken along line IXb-IXb' of FIG. 8.

Referring to FIG. 8, the data lines DL0, DL1, DL2, DL3, DL4, DL5, DL6, and DL7 may extend in the y-direction, and the driving voltage lines PL0, PL1, PL2, PL3, PL4, PL5, PL6, and PL7 may extend in the y-direction. Some driving voltage lines PL0 and PL7 among the driving voltage lines DL0, DL1, DL2, DL3, DL4, DL5, DL6, and DL7 may substantially continuously extend so as to pass across the display area DA, but other driving voltage lines DL1, DL2, DL3, DL4, DL5, and DL6 around the opening area OA may be disconnected (e.g., not substantially continuous as a single body) around the opening area OA. The driving voltage lines that are disconnected and located above the opening area OA among the driving voltage lines PL1, PL2, PL3, PL4, PL5, and PL6 may be connected to the second sub-line 163 described above with reference to FIGS. 4A-4B, and driving voltage lines that are disconnected and located below the opening area OA among the driving voltage lines PL1, PL2, PL3, PL4, PL5, and PL6 may be connected to the first sub-line 162.

The driving voltage lines PL1, PL2, PL3, PL4, PL5, and PL6 that are disconnected (e.g., not substantially continuous) may be substantially connected to a shield layer SDL. The driving voltage lines that are disconnected and located above the opening area OA among the driving voltage lines PL1, PL2, PL3, PL4, PL5, and PL6 may be electrically connected to driving voltage lines that are disconnected and located below the opening area OA among the driving voltage lines PL1, PL2, PL3, PL4, PL5, and PL6 through the shield layer SDL. In an embodiment, the driving voltage lines PL0, PL1, PL2, PL3, PL4, PL5, PL6, and PL7 may be arranged on the same layer as a layer on which the shield layer SDL is arranged, and the driving voltage lines PL1, PL2, PL3, PL4, PL5, and PL6 that are disconnected may be connected to the shield layer SDL on the same layer.

Some data lines DL1, DL2, DL3, DL4, DL5, and DL6 may detour (e.g., may extend in a curve) around the opening area OA. For example, the first to sixth data lines DL1, DL2, DL3, DL4, DL5, and DL6 may respectively include extension portions DL1-SP, DL2-SP, DL3-SP, DL4-SP, DL5-SP, and DL6-SP extending in the y-direction, and detour portions DL1-CP, DL2-CP, DL3-CP, DL4-CP, DL5-CP, and DL6-CP detouring along an edge of the opening area OA. The detour portions DL1-CP, DL2-CP, DL3-CP, DL4-CP, DL5-CP, and DL6-CP respectively associated with the first to sixth data lines DL1, DL2, DL3, DL4, DL5, and DL6 may be located in the first non-display area NDA1. The extension portions DL3-SP and DL4-SP respectively associated with the data lines DL3 and DL4 that neighbor the opening area OA among the data lines DL1, DL2, DL3, DL4, DL5, and DL6 may be longer than the extension portions DL1-SP and DL6-SP respectively associated with the data lines DL1 and DL6 that neighbor the display area DA.

Pixels P located above and below the opening area OA may be electrically connected to the data lines DL1, DL2, DL3, DL4, DL5, and DL6 detouring the opening area OA, and may receive a signal from the relevant data lines DL1, DL2, DL3, DL4, DL5, and DL6. The first to third data lines DL1, DL2, and DL3 (among the data lines DL1, DL2, DL3, DL4, DL5, and DL6) may be curved along a left edge of the opening area OA, and the fourth to sixth data lines DL4, DL5, and DL6 may be curved along a right edge of the opening area OA. Although FIG. 8 depicts three data lines arranged on each of the left and right of the opening area OA for convenience of illustration and description, in some embodiments the number of data lines may be substantially more than three.

Referring to FIGS. 8, 9A, and 9B, the data lines DL1, DL2, DL3, DL4, DL5, and DL6 may respectively include a first conductive line CL1 or a second conductive line CL2, etc., including the detour portions DL1-CP, DL2-CP, DL3-CP, DL4-CP, DL5-CP, and DL6-CP in the first non-display area NDA1, the first conductive line CL1 and the second conductive line CL2 being alternately arranged on different layers (e.g., arranged on alternating layers). For example, data lines closest to each other (e.g. adjacent data lines, such as the first data line DL1 and the second data line DL2) among the data lines DL1, DL2, DL3, DL4, DL5, and DL6 may include conductive lines arranged on different layers in the first non-display area NDA1. For example, in FIGS. 9A-9B, the first conductive line CL1 is on the second insulating layer IL2 and the second conductive line CL2 is on the third insulating layer IL3, but embodiments of the present disclosure are not limited thereto, and the various conductive lines may be on any of the various insulating layers as long as they are alternatively arranged as described above. Through this configuration, a pitch between the data lines DL1, DL2, DL3, DL4, DL5, and DL6 may be reduced so that the non-display area (e.g., a so-called dead space) around the opening area OA may be effectively reduced.

Referring to FIG. 9A showing the first data line DL1 as a reference, the first data line DL1 may include the first conductive line CL1 and a third conductive line CL3, the first conductive line CL1 being located in the first non-display area NDA1, and the third conductive line CL3 being located in the display area DA. The first conductive line CL1 may be arranged on the gate insulating layer IL2 and may include the same material as that of the gate electrode (e.g. the driving gate electrode G1) of FIG. 7. The third conductive line CL3 may be arranged on the second interlayer insulating layer IL4 and may include the same material as that of the electrode layer (e.g. the node connection line 1174 and the connection metal 1175) of FIG. 7. In this case, the electrode layer may be a layer electrically connected to a drain electrode (e.g. the emission control drain electrode D6) of a thin film transistor (e.g. the emission control thin film transistor T6)

The first conductive line CL1 may contact and be electrically connected to the third conductive line CL3 through a contact hole CNT. The contact hole CNT of FIG. 9A may be defined in the first interlayer insulating layer IL3 and the second interlayer insulating layer IL4. A first data signal transferred through the first data line DL1 may be provided from the third conductive line CL3 above the opening area OA to the first conductive line CL1 and then transferred to the third conductive line CL3 below the opening area OA.

Referring to FIG. 9B showing the second data line DL2 as a reference, the second data line DL2 may include the second conductive line CL2 and the third conductive line CL3, the second conductive line CL2 being located in the first non-display area NDA1, and the third conductive line CL3 being located in the display area DA. The second conductive line CL2 may be arranged on the first interlayer insulating layer IL3 and may include the same material as that of the second storage capacitor plate Cst2 of FIG. 7. The third conductive line CL3 may be arranged on the second interlayer insulating layer IL4 and may include substantially the same material as that of the electrode layer (e.g. the node connection line 1174 and the connection metal 1175) of FIG. 7.

The second conductive line CL2 may contact and be electrically connected to the third conductive line CL3 through a contact hole CNT. The contact hole CNT of FIG. 9B may be defined in the second interlayer insulating layer IL4. A second data signal transferred through the second data line DL2 may be provided from the third conductive line CL3 above the opening area OA to the second conductive line CL2 and then transferred to the third conductive line CL3 below the opening area OA.

For reference, the third conductive line CL3 of FIG. 9A and the third conductive line CL3 of FIG. 9B are different signal lines arranged on the same layer. The third conductive line CL3 of FIG. 9A may be a portion of the first data line DL1, and the third conductive line CL3 of FIG. 9B may be a portion of the second data line DL2.

Although FIGS. 9A and 9B show and describe the first data line DL1 and the second data line DL2 as representatives (examples), the structures thereof are applicable to the data lines DL3, DL4, DL5, and DL6 that neighbor each other. For example, the third and fifth data lines DL3 and DL5 may have a cross-sectional structure substantially similar to that of the first data line DL1, and the fourth and sixth data lines DL4 and DL6 may have a cross-sectional structure substantially similar to that of the second data line DL2.

Referring to FIG. 8 again, the shield layer SDL may be arranged in the first non-display area NDA1 and may include a hole SDL-H corresponding to the opening area OA. In an embodiment, a diameter of the hole SDL-H may be greater than a diameter of the opening area OA. The shield layer SDL may overlap portions of the detour portions DL1-CP, DL2-CP, DL3-CP, DL4-CP, DL5-CP, and DL6-CP (each detouring around the opening area OA), and the extension portions DL1-SP, DL2-SP, DL3-SP, DL4-SP, DL5-SP, and DL6-SP of the data lines DL1, DL2, DL3, DL4, DL5, and DL6.

Figure 14:
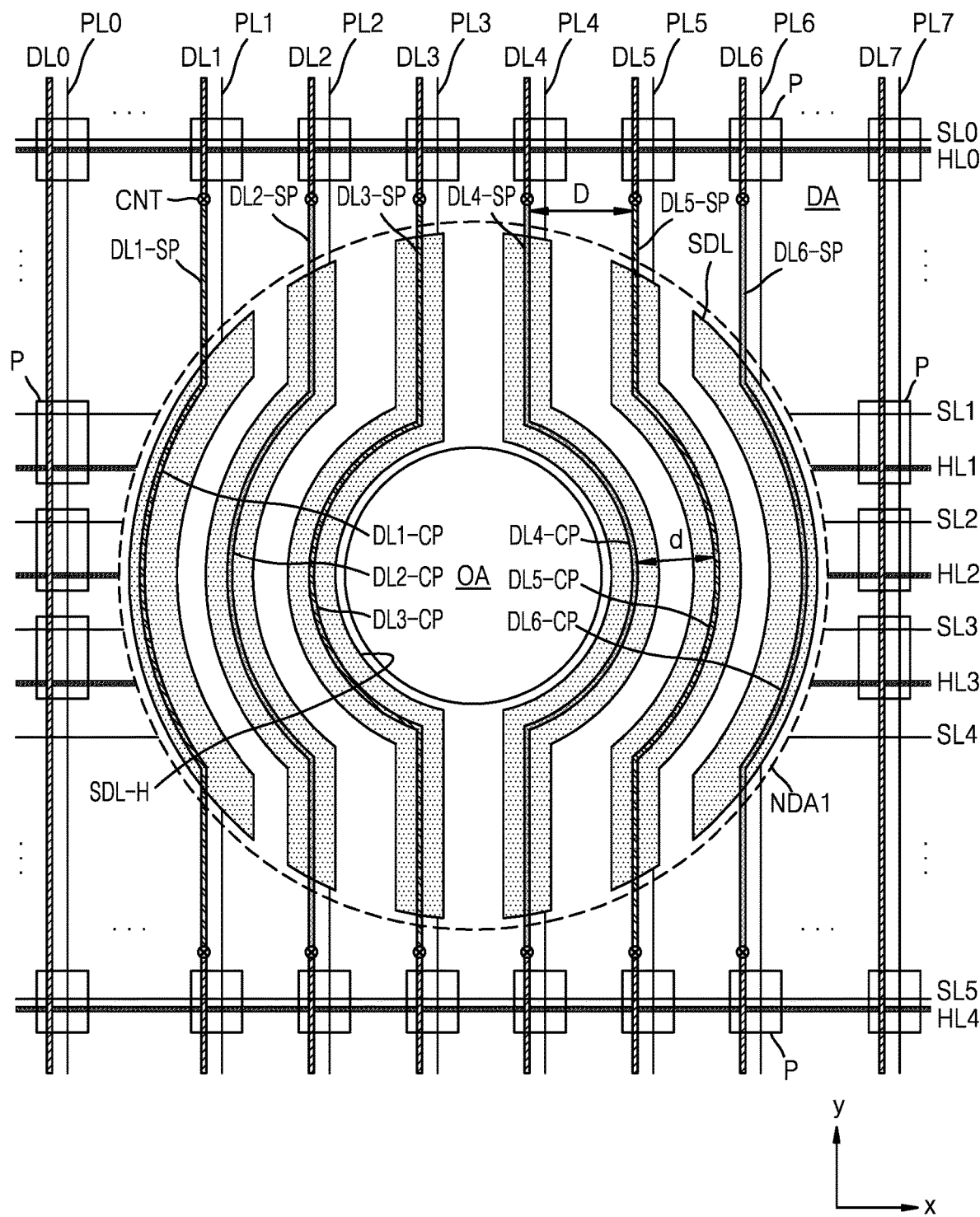
FIG. 14 is a modified example of FIG. 8, showing a plan view of wirings around an opening area according to another embodiment.

Though it is shown in FIG. 8 that the shield layer SDL is provided as one body in the first non-display area NDA1, embodiments are not limited thereto. As shown in FIG. 14, in some embodiments the shield layer SDL may overlap portions of the data lines DL1, DL2, DL3, DL4, DL5, and DL6 located in the first non-display area NDA1 (e.g., and may not overlap remaining portions that are covered in the embodiment depicted in FIG. 8). In another embodiment, the shield layer SDL may be divided into a plurality of patterns, and the patterns may respectively overlap portions of the detour portions DL1-CP, DL2-CP, DL3-CP, DL4-CP, DL5-CP, and DL6-CP and the extension portions DL1-SP, DL2-SP, DL3-SP, DL4-SP, DL5-SP, and DL6-SP of the data lines DL1, DL2, DL3, DL4, DL5, and DL6. In this case, the plurality of patterns included in the shield layer SDL may be spaced apart from each other, and a separation distance between the plurality of patterns may be less than an interval between the data lines DL1, DL2, DL3, DL4, DL5, and DL6. The plurality of patterns may be spaced apart from each other, and may receive the same constant voltage through a connection conductive layer electrically connecting the plurality of patterns.

As shown in FIGS. 9A and 9B, the shield layer SDL may overlap at least a portion of the first conductive line CL1 and the second conductive line CL2 in the first non-display area NDA1. The shield layer SDL may be arranged on the second interlayer insulating layer IL4 and may include the same material as the third conductive line CL3. The shield layer SDL may be electrically separated from the third conductive line CL3. The first planarization insulating layer IL5 may be located on the shield layer SDL and the third conductive line CL3.

Scan lines SL0, SL1, SL2, SL3, SL4, and SL5 may extend in the x-direction intersecting with (e.g., crossing) the data lines DL0, DL1, DL2, DL3, DL4, DL5, DL6, and DL7. Some of the scan lines SL0 and SL5 (among the scan lines SL0, SL1, SL2, SL3, SL4, and SL5) may substantially continuously extend so as to cross the display area DA, while the scan lines SL0, SL1, SL2, SL3, SL4, and SL5 around the opening area OA may be disconnected (e.g., substantially discontinuous) around the opening area OA. The portions of the scan lines SL0, SL1, SL2, SL3, SL4, and SL5 that are disconnected on the left of the opening area OA may be connected to the first scan driving circuit 110 described with reference to FIG. 4, and the portions of the scan lines SL0, SL1, SL2, SL3, SL4, and SL5 that are disconnected on the right of the opening area OA may be connected to the second scan driving circuit 120.

Similar to the scan lines SL0, SL1, SL2, SL3, SL4, and SL5, the electrode voltage lines HL0, HL1, HL2, HL3, and HL4 may extend in the x-direction intersecting with (e.g., crossing) the data lines DL0, DL1, DL2, DL3, DL4, DL5, DL6, and DL7. Some of the electrode voltage lines HL0 and HL4 (among the electrode voltage lines HL0, HL1, HL2, HL3, and HL4) may substantially continuously extend so as to cross the display area DA, while the electrode voltage lines HL1, HL2, and HL3 around the opening area OA may be disconnected around the opening area OA. Referring to FIG. 4, portions of the electrode voltage lines HL1, HL2, and HL3 that are disconnected on the right and the left of the opening area OA may be respectively connected to driving circuits that neighbor the first and second scan driving circuits 110 and 120.

As shown in FIG. 8, a first pitch between the data lines that neighbor each other in the first non-display area NDA1, for example, as represented by an interval d between the detour portions is less than a second pitch as represented by an interval D between the data lines that neighbor each other in the display area DA. When neighboring data lines have the first pitch d within the display area, the display quality of some of the pixels located in the display area DA may be deteriorated by a parasitic capacitance between the data lines.

However, according to the display panel 10 and the display device 1 including the display panel 10 of an embodiment, because the shield layer SDL to which a constant voltage is applied is provided over the data lines DL1, DL2, DL3, DL4, DL5, and DL6, the occurrence of the parasitic capacitance may be reduced.

The shield layer SDL may be arranged in the first non-display area NDA1, and may include the hole SDL-H corresponding to the opening area OA. In an embodiment, a diameter of the hole SDL-H may be greater than a diameter of the opening area OA. The shield layer SDL may be located over the detour portions DL1-CP, DL2-CP, DL3-CP, DL4-CP, DL5-CP, and DL6-CP of the data lines DL1, DL2, DL3, DL4, DL5, and DL6 so as to overlap the detour portions DL1-CP, DL2-CP, DL3-CP, DL4-CP, DL5-CP, and DL6-CP. Referring to FIGS. 9A and 9B, the shield layer SDL may be located over the first conductive line CL1 and the second conductive line CL2 each including the detour portions DL1-CP, DL2-CP, DL3-CP, DL4-CP, DL5-CP, and DL6-CP.

A constant voltage may be applied to the shield layer SDL. In FIG. 8, the driving voltage lines PL1, PL2, PL3, PL4, PL5, and PL6 around the opening area OA may be disconnected around the opening area OA and connected to the shield layer SDL to communicate with the shield layer SDL. Therefore, the shield layer SDL may have the same voltage level as the driving voltage lines PL1, PL2, PL3, PL4, PL5, and PL6. In an embodiment, a constant voltage of +5V may be applied to the driving voltage lines PL1, PL2, PL3, PL4, PL5, and PL6, and the shield layer SDL may have the same constant voltage of +5V.

Figure 10A:
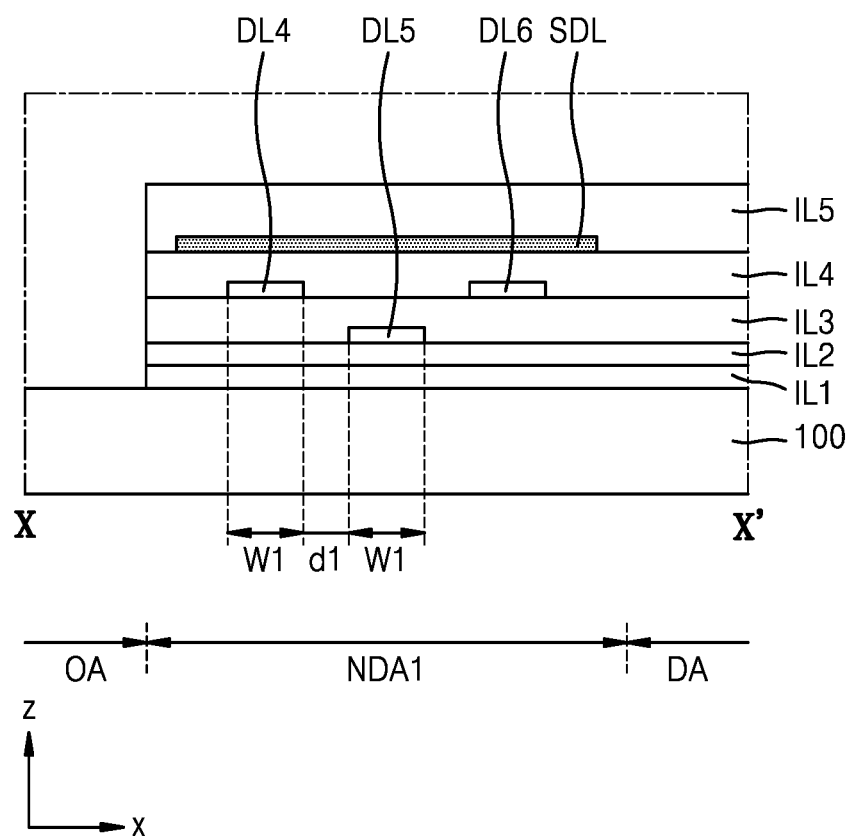
FIG. 10A is a cross-sectional view of a wiring taken along line IX-IX' of FIG. 8.
Figure 10B:
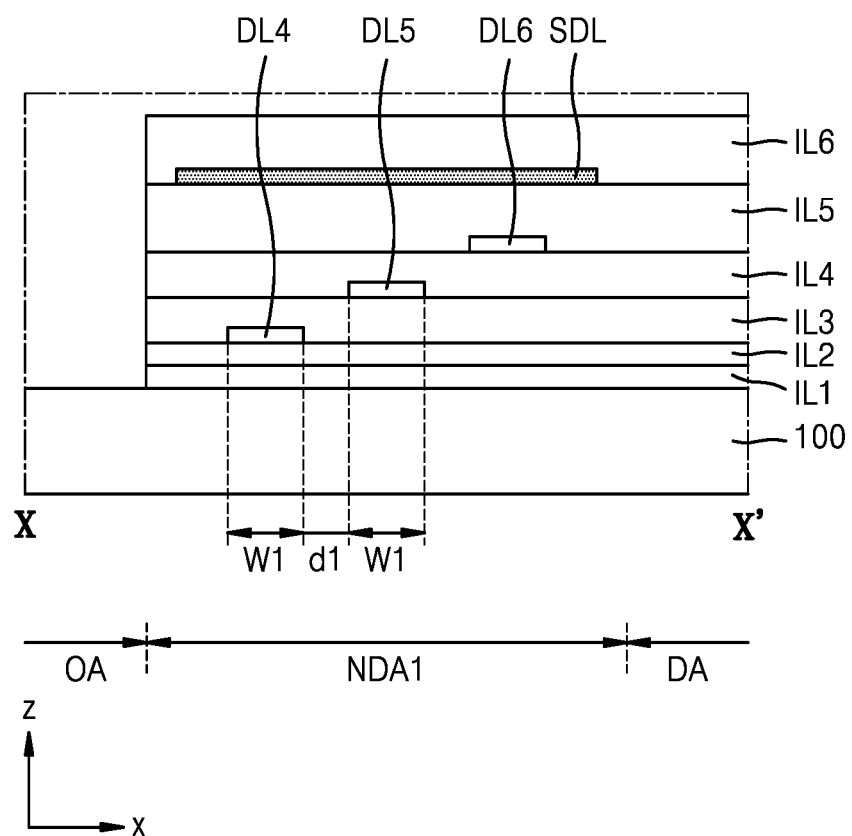
FIG. 10B is a modified example of FIG. 10A and corresponds to cross-sections of FIGS. 6B and 7B.

FIG. 10A is a cross-sectional view of a wiring taken along line IX-IX' of FIG. 8, and FIG. 10B is a modified example of FIG. 10. FIG. 10B is a cross-sectional view corresponding to FIGS. 6B and 7B.

FIG. 10A shows the fourth to sixth data lines DL4, DL5, and DL6 located on the left of the opening area OA. Referring to FIG. 10A, the fourth data line DL4 and the sixth data line DL6 may be arranged on the first interlayer insulating layer IL3, and the fifth data line DL5 may be arranged on the gate insulating layer IL2. As described above, the fourth to sixth data lines DL4, DL5, and DL6 closest to one another may be alternately (e.g., alternatingly) arranged on different layers in the first non-display area NDA1.

In an embodiment, the fourth data line DL4 and the fifth data line DL5 may be provided in a first width W1 and may have the same width. An interval d1 between the fourth data line DL4 and the fifth data line DL5 may be less than the first width W1. For example, the first width W1 of the fourth to sixth data lines DL4, DL5, and DL6 may be about twice the interval d1 between the fourth to sixth data lines DL4, DL5, and DL6. The first width W1 may be about 2 μm to about 2.4 μm.

In a comparative example, in the case where all of the data lines are arranged on the same layer, it may be very difficult to reduce an interval (pitch) between the data lines below a set or predetermined distance, due to the width of the data lines and a parasitic capacitance therebetween. Therefore, there may be a limit in reducing the non-display area (a dead space) around the opening area OA.

In contrast, according to an embodiment, because the fourth to sixth data lines DL4, DL5, and DL6 closest to one another are alternately arranged on different layers, the interval d1 between the fourth to sixth data lines DL4, DL5, and DL6 may be reduced regardless of the first width W1 of the fourth to sixth data lines DL4, DL5, and DL6. In the case where the interval d1 between the fourth to sixth data lines DL4, DL5, and DL6 is reduced below a set or predetermined distance, a parasitic capacitance therebetween may occur. To prevent or reduce this effect, the shield layer SDL may be provided over the fourth to sixth data lines DL4, DL5, and DL6, and a constant voltage may be applied to the shield layer SDL.

The shield layer SDL may overlap the fourth to sixth data lines DL4, DL5, and DL6 in the first non-display area NDA1. The shield layer SDL may be covered by the first planarization insulating layer IL5.

No layers may be arranged on a portion of the substrate 100 in the opening area OA of FIG. 10A. A material layer may be located on the substrate 100, the material layer including at least one of an organic material, an inorganic material, and a conductive material (e.g. the insulating layers IL1, IL2, IL3, IL4, and IL5 and/or the conductive layers DL4, DL5, DL6, and SDL). The material layers corresponding to the opening area OA may be removed. However, the embodiment is not limited thereto. In another embodiment, some insulating layers may remain in the opening area OA.

In another embodiment, referring to FIG. 10B, the fourth data line DL4 may be arranged on the gate insulating layer IL2, the fifth data line DL5 may be arranged on the first interlayer insulating layer IL3, and the sixth data line DL6 may be arranged on the second interlayer insulating layer IL4. As described above, the fourth to sixth data lines DL4, DL5, and DL6 closest to one another may be alternately arranged on different layers in the first non-display area NDA1. Thought it is shown in FIG. 10 that the fourth to sixth data lines DL4, DL5, and DL6 may be alternately arranged on three different layers (for example, the gate insulating layer IL2, the first interlayer insulating layer IL3, and the second interlayer insulating layer IL4), embodiments are not limited thereto. The fourth to sixth data lines DL4, DL5, and DL6 may be alternately arranged on two layers among the three layers.

The shield SDL may overlap the fourth to sixth data lines DL4, DL5, and DL6 in the first non-display area NDA1. The shield layer SDL may be arranged on the first planarization insulating layer IL5 and may be covered by the second planarization insulating layer IL6. The shield layer SDL of FIG. 10B may include the same material as the contact metal 1176 and may be arranged on the same layer as the contact metal 1176.

Figure 11:
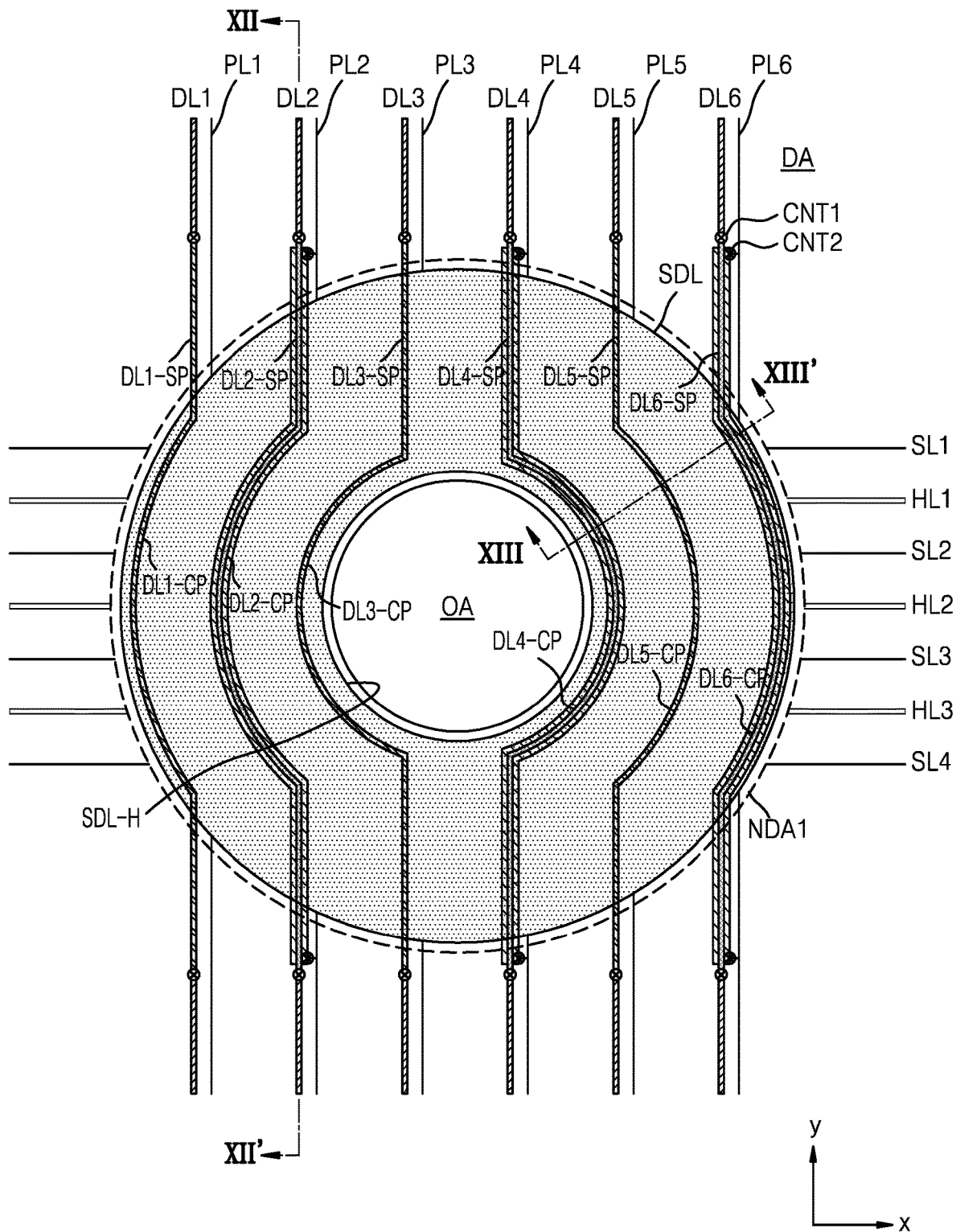
FIG. 11 is a plan view of wirings around an opening area according to another embodiment.
Figure 12:
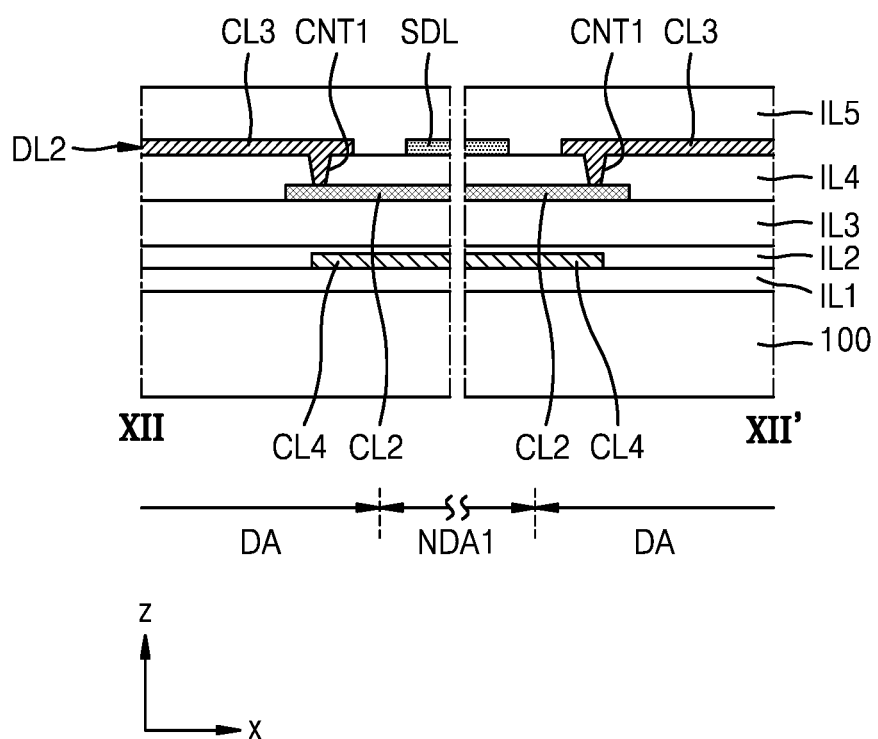
FIG. 12 is a cross-sectional view of a wiring taken along line XII-XII' of FIG. 11.
Figure 13A:
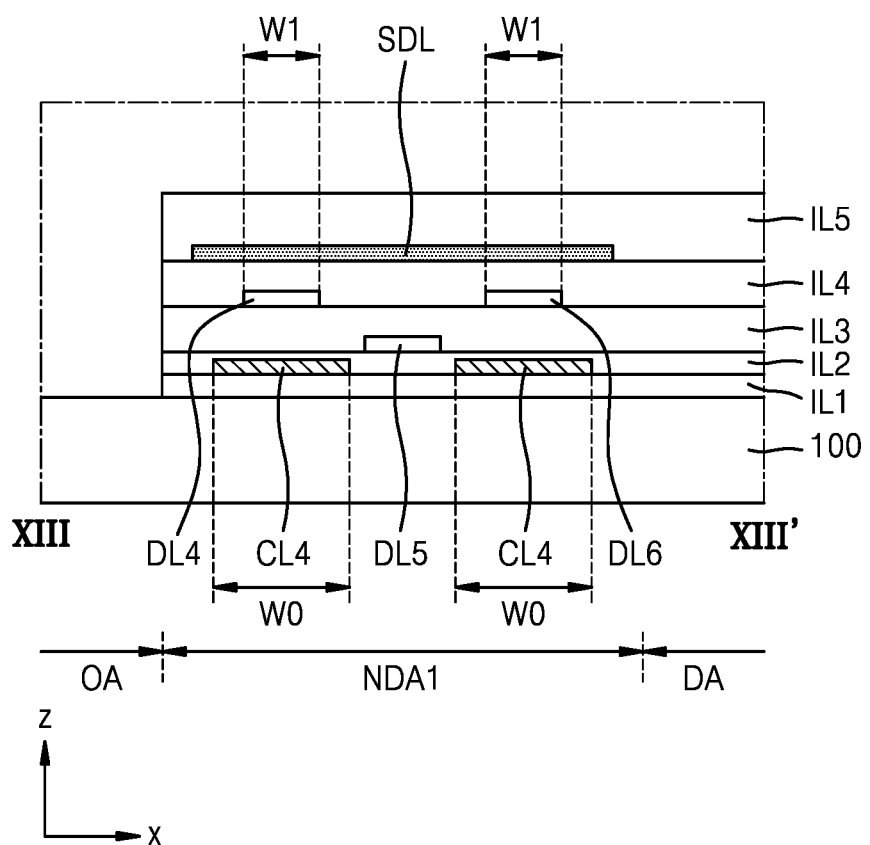
FIG. 13A is a cross-sectional view of a wiring taken along line XIII-XIII' of FIG. 11.
Figure 13B:
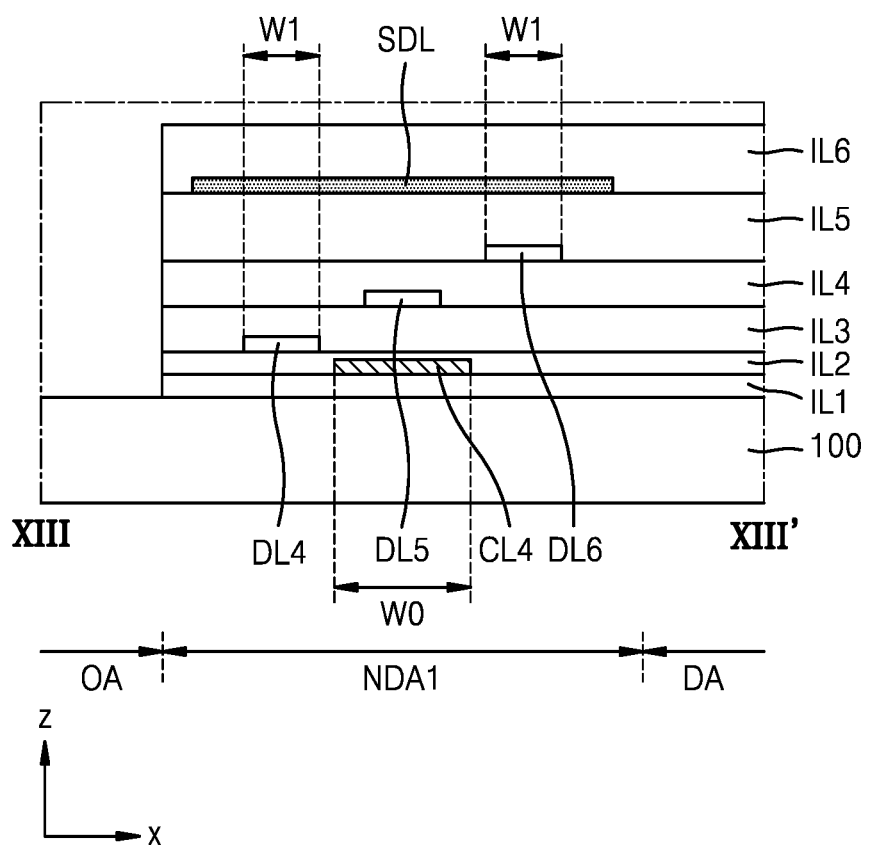
FIG. 13B is a modified example of FIG. 13A and corresponds to a cross-section of FIG. 10B.

FIG. 11 is a plan view of wirings around the opening area OA according to another embodiment, FIG. 12 is a cross-sectional view of a wiring taken along line XII-XII' of FIG. 11, FIG. 13A is a cross-sectional view of a wiring taken along line XIII-XIII' of FIG. 11, and FIG. 13B is a modified example of FIG. 13A. FIG. 13B shows a cross-sectional view corresponding to FIG. 11B.

The embodiment of FIGS. 11-12 is different from the embodiment of FIG. 8 in that a conductive layer (hereinafter referred to as a fourth conductive line CL4) is arranged below the data lines DL2, DL4, and DL6. Because other aspects of the configuration are substantially similar to those of FIG. 8, the below description will focus on differences related to the fourth conductive line CL4.

Referring to FIG. 12, the fourth conductive line CL4 may be arranged below some data lines DL2, DL4, and DL6. The fourth conductive line CL4 may be provided along the shapes of the data lines DL2, DL4, and DL6. For example, the fourth conductive line CL4 may also include a detour portion curved around the opening area OA. The fourth conductive line CL4 may extend to a portion of the display area DA along the extension portions DL2-SP, DL4-SP, and DL6-SP of the data lines DL2, DL4, and DL6. In another embodiment, the fourth conductive line CL4 may not extend to the display area DA and may be located only inside the first non-display area NDA1.

A constant voltage may be applied to the fourth conductive line CL4. The constant voltage applied to the fourth conductive line CL4 may have the same voltage level as that of the shield layer SDL. As shown in FIG. 11, the fourth conductive line CL4 may have the same voltage level as the driving voltage lines PL2, PL4, and PL6 by electrically contacting the driving voltage lines PL2, PL4, and PL6 neighboring the data lines DL2, DL4, and DL6 through contact holes CNT1 and CNT2. Though FIG. 11 depicts an embodiment in which the fourth conductive line CL4 contacts the driving voltage lines PL2, PL4, and PL6, in some embodiments the fourth conductive line CL4 may have the same constant voltage by contacting the shield layer SDL.

Referring to FIG. 12, the fourth conductive line CL4 may be located on the buffer layer IL1. The fourth conductive line CL4 may include the same material as the semiconductor layer 1130 of FIG. 7A (or FIGS. 6B and 7B). The second conductive line CL2 may be located over the fourth conductive line CL4. As described in FIG. 9B, the second conductive line CL2 may contact and be electrically connected to the third conductive line CL3 through the contact hole CNT1 defined in the second interlayer insulating layer IL4.

Referring to FIG. 13A, the fourth conductive line CL4 may be located only below the fourth data line DL4 and the sixth data line DL6, which are arranged on the first interlayer insulating layer IL3. When the fourth conductive line CL4 is located below the fourth data line DL4 and the sixth data line DL6, a coupling capacitance between the data lines that neighbor each other may be effectively reduced.

A width W0 of the fourth conductive line CL4 may be greater than the first width W1 of each of the fourth data line DL4 and the sixth data line DL6. For example, a very large number of data lines may be formed, and therefore, fine control is desired in forming an interval and a width of the data lines. In this case, even though a defect in which alignment of the data lines is twisted may occur, because the width W0 of the fourth conductive line CL4 in the lower portion is wider than the first width W1 of each of the fourth data line DL4 and the sixth data line DL6, the fourth data line DL4 and the sixth data line DL6 may be stably formed.

Likewise, the shield layer SDL may be over (on) and may overlap the data lines DL2, DL4, and DL6. When the shield layer SDL and the fourth conductive line CL4 have the same constant voltage as shown in FIG. 13A, a coupling capacitance between the data lines DL2, DL4, and DL6 may be reduced by at least half.

In another embodiment, referring to FIG. 13B, the fourth conductive line CL4 may be located only below the fifth data line DL5 arranged on the first interlayer insulating layer IL3. When the fourth conductive line CL4 is located below the fifth data line DL5, a coupling capacitance between the data lines that neighbor each other may be effectively reduced.

According to an embodiment, a display panel having an improved reliability and a reduced non-display area, and a display device including the display panel may be provided. However, the scope of the present disclosure is not limited by this effect.

It should be understood that embodiments described herein should be considered in a descriptive sense only and not for purposes of limitation. Descriptions of features or aspects within each embodiment should typically be considered as being available for other similar features or aspects in other embodiments. While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A display panel comprising:
a substrate comprising a non-display area and a display area surrounding the non-display area, the non-display area surrounding a transmission area;
a plurality of display elements in the display area;
a plurality of first lines extending in a first direction, each comprising a detour portion that detours around an edge of the transmission area; and
a shield layer overlapping the detour portion(s) in the non-display area,
wherein each of the plurality of first lines is located in the non-display area and comprises a first conductive line or a second conductive line comprising the detour portion, the first conductive line(s) and the second conductive line(s) being alternately arranged on different layers, and
wherein the shield layer has a hole corresponding to the transmission area.

2. The display panel of claim 1, wherein the shield layer has a constant voltage.

3. The display panel of claim 1, wherein the shield layer does not overlap the transmission area.

4. The display panel of claim 1, further comprising a plurality of third lines extending in a second direction intersecting with the first direction in the display area and disconnected outside the non-display area.

5. The display panel of claim 1, wherein a distance between adjacent ones of the first conductive line and the second conductive line is less than a width of each of the first conductive line and the second conductive line.

6. The display panel of claim 1, wherein each of the plurality of first lines further comprises a third conductive line in the display area.

7. The display panel of claim 6, wherein the third conductive line is over both of the first conductive line and the second conductive line with an insulating layer therebetween, and is connected to the first conductive line or the second conductive line through a contact hole defined in the insulating layer.

8. The display panel of claim 6, further comprising a thin film transistor and a storage capacitor in the display area, each being connected to a corresponding one of the plurality of display elements,
wherein the thin film transistor comprises a semiconductor layer, a gate electrode, and an electrode layer, the gate electrode overlapping at least a portion of the semiconductor layer, and the electrode layer being connected to the semiconductor layer, and
the storage capacitor comprises a bottom electrode and a top electrode, the bottom electrode comprising the same material as the gate electrode, and the top electrode being between the bottom electrode and the electrode layer.

9. The display panel of claim 8, wherein the first conductive line and the gate electrode are formed of the same material.

10. The display panel of claim 8, wherein the second conductive line and the top electrode are formed of the same material.

11. The display panel of claim 8, wherein the third conductive line and the electrode layer are formed of the same material.

12. The display panel of claim 8, wherein the shield layer and the electrode layer are formed of the same material.

13. The display panel of claim 8, further comprising a fourth conductive line below the second conductive line and overlapping the second conductive line.

14. The display panel of claim 13, wherein the fourth conductive line and the semiconductor layer are formed of the same material.

15. The display panel of claim 13, wherein the fourth conductive line is greater in width than the second conductive line.

16. The display panel of claim 13, wherein the same voltage is applied to the shield layer and the fourth conductive line.

17. The display panel of claim 1, further comprising:
an encapsulation substrate covering the plurality of display elements and facing the substrate; and
a sealing material surrounding the display area between the substrate and the encapsulation substrate.

18. The display panel of claim 17, further comprising a material layer between the substrate and the encapsulation substrate, the material layer comprising at least one selected from an organic material, an inorganic material, and a conductive material,
wherein the material layer is not present in the transmission area.

19. A display panel comprising:
a substrate comprising a non-display area and a display area surrounding the non-display area, the non-display area surrounding a transmission area;
a plurality of display elements in the display area;
a plurality of first lines extending in a first direction, each comprising a detour portion that detours around an edge of the transmission area;
a shield layer overlapping the detour portion(s) in the non-display area; and
a plurality of second lines extending in the first direction and having the same voltage as the shield layer,
wherein the shield layer has a constant voltage, and
wherein each of the plurality of first lines is located in the non-display area and comprises a first conductive line or a second conductive line comprising the detour portion, the first conductive line(s) and the second conductive line(s) being alternately arranged on different layers.

20. The display panel of claim 19, wherein the shield layer and the plurality of second lines comprise the same material.

21. A display device comprising:
a substrate comprising a non-display area and a display area surrounding the non-display area, the non-display area surrounding a transmission area;
a plurality of display elements in the display area;
a plurality of first lines extending in a first direction, each comprising a detour portion that detours around an edge of the transmission area;

a shield layer over the detour portion(s) in the non-display area; and an electronic element corresponding to the transmission area, a plurality of third lines extending in a second direction intersecting with the first direction in the display area and disconnected outside the non-display area.

\* \* \* \* \*